(12) United States Patent
Kim et al.

(10) Patent No.: US 12,125,766 B2
(45) Date of Patent: Oct. 22, 2024

(54) THERMOELECTRIC COOLING PACKAGES

(71) Applicant: Samsung Electronics Co., Ltd., Suwon-si (KR)

(72) Inventors: Tae Hwan Kim, Hwaseong-si (KR); Jae Choon Kim, Incheon (KR); Kyung Suk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 17/537,689

(22) Filed: Nov. 30, 2021

(65) Prior Publication Data

US 2022/0359341 A1 Nov. 10, 2022

(30) Foreign Application Priority Data

May 6, 2021 (KR) .......................... 10-2021-0058697

(51) Int. Cl.
*H01L 35/32* (2006.01)
*F25B 21/02* (2006.01)
(Continued)

(52) U.S. Cl.
CPC .......... *H01L 23/38* (2013.01); *H01L 23/3121* (2013.01); *H01L 23/3738* (2013.01);
(Continued)

(58) Field of Classification Search
CPC .......... H01L 23/3128; H01L 25/10–13; H01L 23/38; H01L 23/3121; H01L 23/3738; H01L 23/481; H01L 23/5226; H01L 23/66; H01L 23/5386; H01L 23/3672; H01L 23/4824; H01L 23/485; H01L 23/528; H01L 24/16; H01L 25/16; H01L 24/73;
(Continued)

(56) References Cited

U.S. PATENT DOCUMENTS 7,034,394 B2 4/2006 Ramanathan et al.
7,301,233 B2 11/2007 Lee et al.
(Continued)

FOREIGN PATENT DOCUMENTS

| KR | 19980078151 A | 11/1998 |
| KR | 20100000439 A | 1/2010 |
| KR | 20150146365 A | 12/2015 |

*Primary Examiner* — Mary A Wilczewski
*Assistant Examiner* — Tsz K Chiu
(74) *Attorney, Agent, or Firm* — Muir Patent Law, PLLC

(57) ABSTRACT

A semiconductor package includes a first package substrate, a first semiconductor chip on the first package substrate, a plurality of first chip bumps between the first package substrate and the first semiconductor chip, a plurality of second semiconductor chips sequentially stacked on the first semiconductor chip, a molding member which covers the plurality of second semiconductor chips, on the first semiconductor chip, and a thermoelectric cooling layer attached onto a surface of the first semiconductor chip. The thermoelectric cooling layer includes a cooling material layer extending along the surface of the first semiconductor chip, a first electrode pattern which surrounds the plurality of first chip bumps from a planar viewpoint, in the cooling material layer, and a second electrode pattern which surrounds the first electrode pattern from the planar viewpoint, in the cooling material layer.

20 Claims, 18 Drawing Sheets

(51) Int. Cl.
  *H01L 23/00* (2006.01)
  *H01L 23/31* (2006.01)
  *H01L 23/373* (2006.01)
  *H01L 23/38* (2006.01)
  *H01L 23/48* (2006.01)
  *H01L 23/522* (2006.01)
  *H01L 25/16* (2023.01)

(52) U.S. Cl.
  CPC ........ *H01L 23/481* (2013.01); *H01L 23/5226* (2013.01); *H01L 24/16* (2013.01); *H01L 25/16* (2013.01); *H01L 24/73* (2013.01); *H01L 2224/16146* (2013.01); *H01L 2224/16227* (2013.01); *H01L 2224/73204* (2013.01)

(58) Field of Classification Search
  CPC ......... H01L 25/18; H01L 25/50; H01L 24/17; H01L 24/13; H01L 24/15; H01L 2224/16146; H01L 2224/16227; H01L 2224/73204; H01L 2225/06513; H01L 2224/13008; H01L 2224/1712; H01L 2225/06517; H01L 2225/06541; H01L 2225/06589; H10B 43/27; H10B 41/35; H10B 41/41; H10B 41/27; H10B 43/35; H10B 43/40; H10B 43/10; H10B 43/50
  See application file for complete search history.

(56) References Cited

U.S. PATENT DOCUMENTS

| | | | | |
|---|---|---|---|---|
| 7,354,798 | B2 * | 4/2008 | Pogge | H01L 25/50 257/E21.705 |
| 8,674,491 | B2 | 3/2014 | Liu et al. | |
| 8,710,670 | B2 * | 4/2014 | Kim | H01L 21/76898 257/E21.597 |
| 8,933,540 | B2 * | 1/2015 | Daubenspeck | H01L 25/0657 257/621 |
| 9,228,763 | B2 * | 1/2016 | Kim | H10N 10/17 |
| 9,368,479 | B2 * | 6/2016 | Katkar | H01L 23/5386 |
| 9,625,186 | B2 | 4/2017 | Chou et al. | |
| 9,671,141 | B2 | 6/2017 | Kim et al. | |
| 9,746,889 | B2 | 8/2017 | Mittal et al. | |
| 10,431,547 | B2 * | 10/2019 | Nam | H01L 25/0657 |
| 10,504,816 | B2 | 12/2019 | Beauchemin et al. | |
| 10,727,204 | B2 * | 7/2020 | Agarwal | H01L 21/76898 |
| 10,790,213 | B2 * | 9/2020 | Kim | H01L 29/41 |
| 10,797,037 | B1 * | 10/2020 | Lin | G11C 7/1078 |
| 10,867,892 | B1 * | 12/2020 | Chang | H10N 19/00 |
| 11,062,971 | B2 * | 7/2021 | Hung | H01L 23/5384 |
| 11,183,487 | B2 * | 11/2021 | Lai | H01L 21/78 |
| 11,373,929 | B1 * | 6/2022 | Refai-Ahmed | H01L 23/473 |
| 11,721,604 | B2 * | 8/2023 | Choi | H01L 25/0657 257/737 |
| 2010/0163090 | A1 * | 7/2010 | Liu | H10N 10/17 136/224 |
| 2012/0049353 | A1 * | 3/2012 | Osenbach | H01L 24/20 257/737 |
| 2013/0052775 | A1 * | 2/2013 | Kim | H01L 23/34 438/118 |
| 2014/0203397 | A1 * | 7/2014 | Yen | H01L 21/76885 438/381 |
| 2015/0333026 | A1 * | 11/2015 | Gandhi | H01L 24/13 438/618 |
| 2015/0357269 | A1 * | 12/2015 | Im | H01L 25/0657 257/676 |
| 2016/0334845 | A1 * | 11/2016 | Mittal | G05D 23/1906 |
| 2019/0273029 | A1 * | 9/2019 | Tuttle | H01L 21/56 |
| 2019/0287877 | A1 * | 9/2019 | Kim | H01L 25/0657 |
| 2020/0144237 | A1 * | 5/2020 | Kang | H10N 10/817 |
| 2020/0294884 | A1 | 9/2020 | Shaikh et al. | |
| 2021/0043541 | A1 * | 2/2021 | Eid | H01L 23/42 |
| 2022/0149022 | A1 * | 5/2022 | Goto | H01J 45/00 |

* cited by examiner

THERMOELECTRIC COOLING PACKAGES

This application claims priority to Korean Patent Application No. 10-2021-0058697, filed on May 6, 2021, and all the benefits accruing therefrom under 35 U.S.C. § 119, the disclosure of which is incorporated herein by reference in its entirety.

BACKGROUND

1. Technical Field

The present inventive concept relates to a semiconductor package. More specifically, the present inventive concept relates to a semiconductor package including a thermoelectric cooling layer.

2. Description of the Related Art

With rapid development of an electronic industry and demands of users, electronic devices become smaller, more lightweight, and more multifunctional, and semiconductor packages used in the electrical devices are also desirable to be smaller, more lightweight, and more multifunctional. To this end, by integrating a plurality of semiconductor chips into a single semiconductor package, it has been possible to increase the capacity and multifunction of the semiconductor package, while significantly reducing the size of the semiconductor package.

On the other hand, in order to achieve a high capacity of the semiconductor package, it is necessary to stack more semiconductor chips than before. However, in such a case, the heat radiation characteristic of the semiconductor chip is deteriorated, and there arises a problem that the performance is restricted by the temperature. Therefore, there is a need for a method for effectively dissipating heat generated from the semiconductor chip.

SUMMARY

Aspects of the present inventive concept provide a semiconductor package having improved product reliability and performance.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor package comprising a first package substrate, a first semiconductor chip on the first package substrate, a plurality of first chip bumps between the first package substrate and the first semiconductor chip, a plurality of second semiconductor chips sequentially stacked on the first semiconductor chip, a molding member which covers the plurality of second semiconductor chips, on the first semiconductor chip, and a thermoelectric cooling layer attached onto a surface of the first semiconductor chip, wherein the thermoelectric cooling layer includes a cooling material layer extending along the surface of the first semiconductor chip, a first electrode pattern in the cooling material layer and, when the semiconductor package is viewed in a plan view, surrounding a region where the plurality of first chip bumps are disposed, and a second electrode pattern in the cooling material layer and, when the semiconductor package is viewed in a plan view, surrounding the first electrode pattern.

According to an aspect of the present inventive concept, there is provided a semiconductor package comprising a package substrate, a plurality of chip bumps on the package substrate, a semiconductor chip connected to the plurality of chip bumps, and a thermoelectric cooling layer which includes a cooling material layer extending along a surface of the semiconductor chip, a first electrode pattern in the cooling material layer and, when the semiconductor package is viewed in a plan view, surrounding a region where the plurality of chip bumps are disposed, and a second electrode pattern in the cooling material layer and spaced apart from the region where the plurality of chip bumps are formed farther than the first electrode pattern. The first electrode pattern and the second electrode pattern have different potentials from each other.

According to an aspect of the present inventive concept, there is provided a semiconductor package comprising a package substrate, a plurality of chip bumps on the package substrate, a semiconductor chip which includes a semiconductor substrate, a chip wiring layer that electrically connects the plurality of chip bumps to the semiconductor substrate, and a through via that penetrates the semiconductor substrate and is connected to the chip wiring layer, and a thermoelectric cooling layer interposed between the chip wiring layer and a region where the plurality of chip bumps are disposed. The thermoelectric cooling layer includes a cooling material layer extending along a lower surface of the chip wiring layer facing the package substrate, a cooling layer wiring structure disposed in the cooling material layer and electrically connecting at least some of the plurality of chip bumps to the chip wiring layer, a first electrode pattern in the cooling material layer and, when the semiconductor package is viewed in a plan view, surrounding the region where the plurality of chip bumps are disposed, and a second electrode pattern in the cooling material layer and spaced apart from the region where the plurality of chip bumps are disposed farther than the first electrode pattern.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Although terms such as first and second are used herein to describe various elements or components, these elements or components are not limited by such terms. These terms are used to merely distinguish a single element or component from other elements or components. Therefore, a first element or component described below may be a second element or component within the technical idea of the present inventive concept.

Hereinafter, a semiconductor package according to some exemplary embodiments will be described referring to FIGS. 1 to 20.

Figure 1:
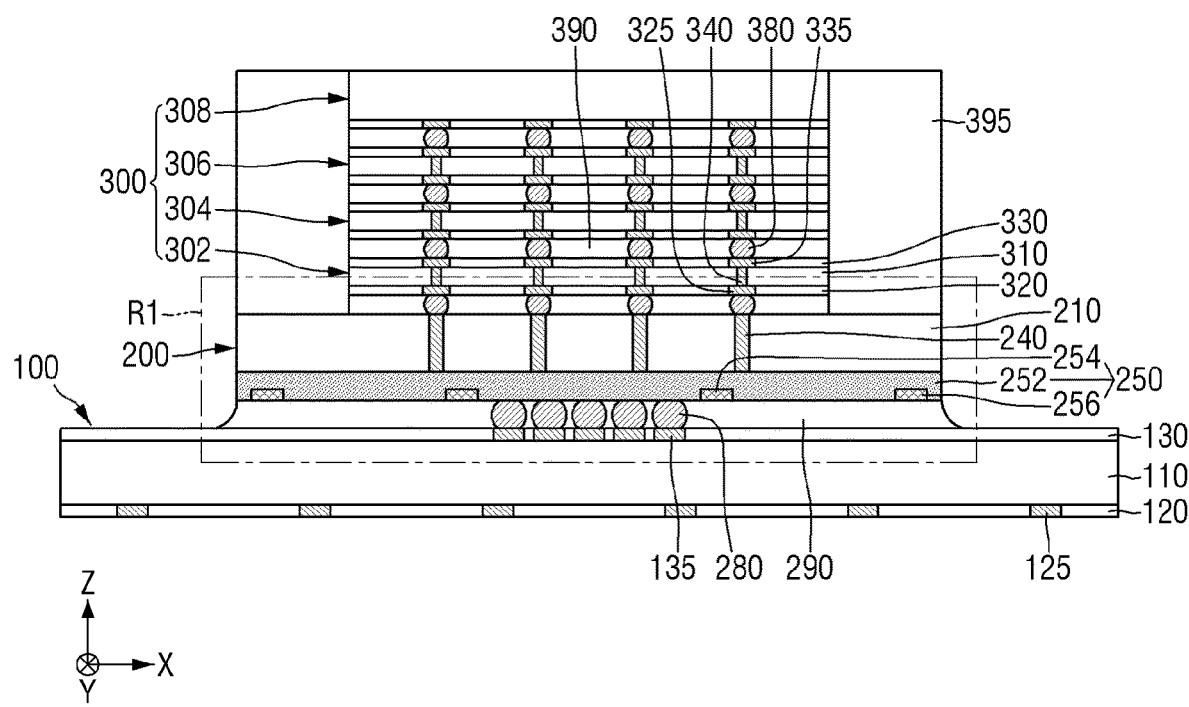
FIG. 1 is a cross-sectional view for explaining a semiconductor package according to some embodiments.
Figure 2:
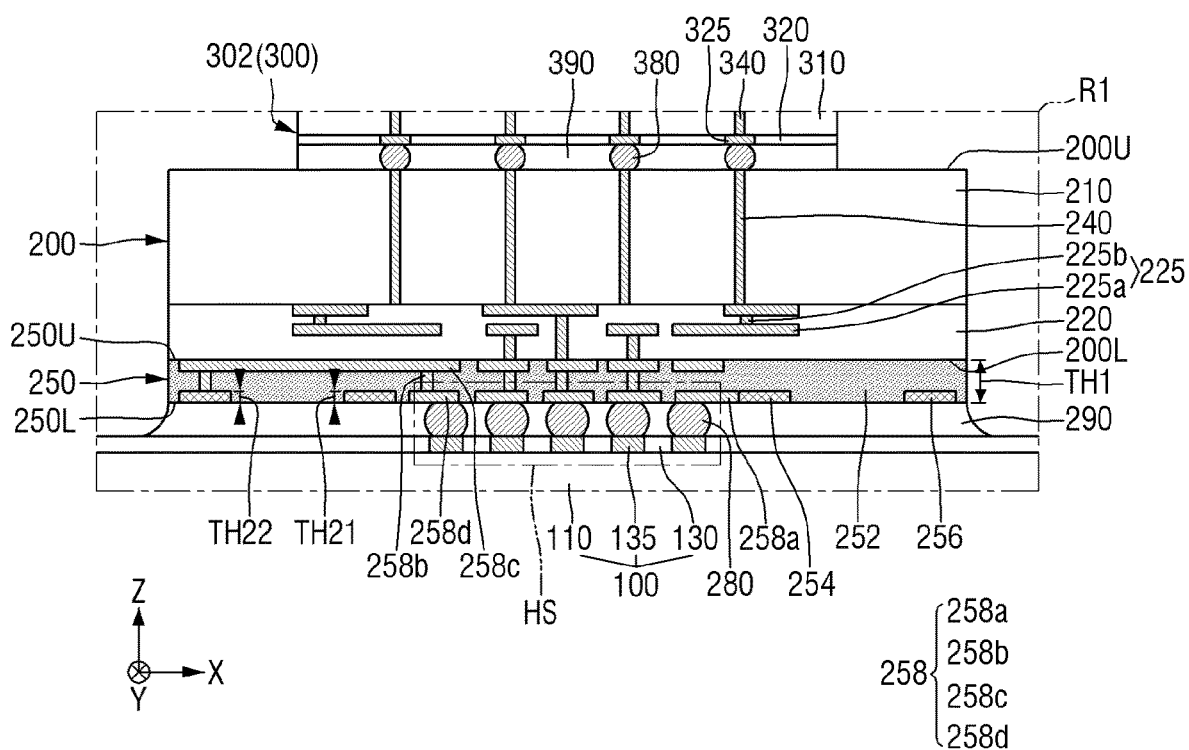
FIG. 2 is a partially enlarged view for explaining a region R1 of FIG. 1.
Figure 3:
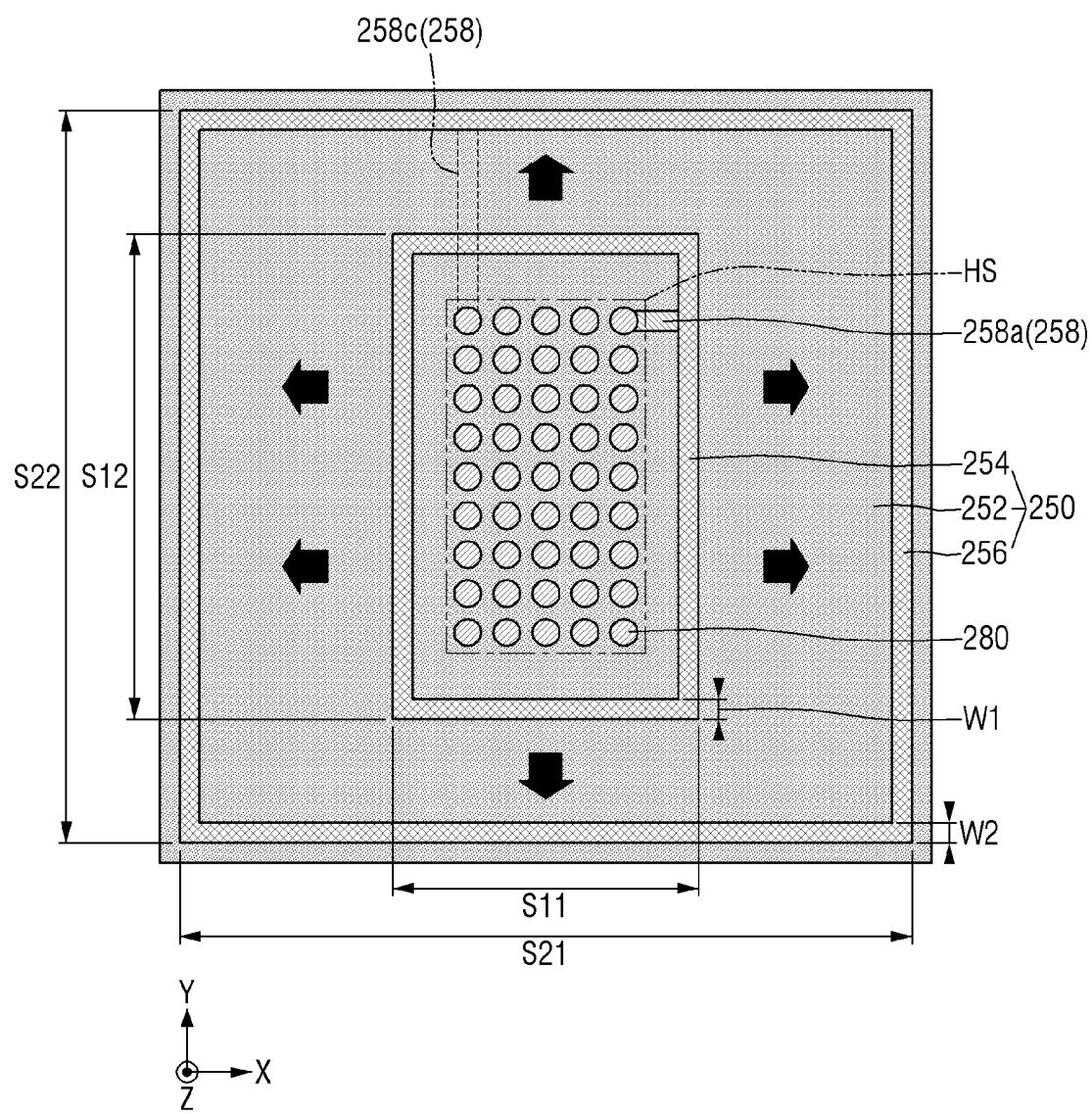
FIG. 3 is a plan view for explaining a thermoelectric cooling layer of FIG. 2.

FIG. 1 is a cross-sectional view for explaining a semiconductor package according to some embodiments. FIG. 2 is a partially enlarged view for explaining a region R1 of FIG. 1. FIG. 3 is a plan view for explaining a thermoelectric cooling layer of FIG. 2.

Referring to FIGS. 1 to 3, the semiconductor package according to some embodiments includes a first package substrate 100, a plurality of first chip bumps 280, a first semiconductor chip 200, a thermoelectric cooling layer 250, a plurality of second semiconductor chips 300, and a first molding member 395.

The first package substrate 100 may be, for example, a printed circuit board (PCB), a ceramic substrate or an interposer. In some embodiments, the first package substrate 100 may be a substrate for a wafer level package (WLP) or a substrate for a package level package (PLP). The first package substrate 100 may include a substrate base 110, a first substrate pad 125, and a second substrate pad 135.

The substrate base 110 may include or may be formed of insulating films such as a plastic material or a ceramic material, and conductive vias and conductive wirings placed inside the insulating films. The first substrate pad 125 and the second substrate pad 135, which will be described later, may be electrically connected by the conductive vias and the conductive wirings.

When the first package substrate 100 is an interposer, the substrate base 110 may include a semiconductor film (e.g., a silicon film). For example, the substrate base 110 may be formed from a silicon wafer.

The first substrate pad 125 may be exposed from (i.e., exposed at) a lower surface of the first package substrate 100. For example, a first substrate protective layer 120 that covers the lower surface of the substrate base 110 may be formed. The first substrate pad 125 may be exposed from the first substrate protective layer 120. The first substrate protective layer 120 may be, but is not limited to, a solder resist layer.

The second substrate pad 135 may be exposed from an upper surface of the first package substrate 100. For example, a second substrate protective layer 130 that covers the upper surface of the substrate base 110 may be formed. The second substrate pad 135 may be exposed from the second substrate protective layer 130. The second substrate protective layer 130 may be, but is not limited to, a solder resist layer.

Each of the first substrate pad 125 and the second substrate pad 135 may include or may be formed of, but is not limited to, at least one of copper (Cu), beryllium copper, nickel (Ni), and stainless steel. The first substrate pad 125 may be a portion which is exposed by the first substrate protective layer 120 among circuit wirings patterned after the lower surface of the substrate base 110 is coated with copper foil (Cu foil). The second substrate pad 135 may be a portion which is exposed by the second substrate protective layer 130 among circuit wirings patterned after the upper surface of the substrate base 110 is coated with copper foil.

A plurality of first chip bumps 280 may be placed on the upper surface of the first package substrate 100. The first chip bumps 280 may be electrically connected to the first package substrate 100. For example, the first chip bumps 280 may be in contact with the second substrate pads 135, respectively. In some embodiments, the first chip bumps 280 and the second substrate pads 135 may have the same number as each other. The first chip bumps 280 may be, for example, a solder ball, a bump, a UBM (under bump metallurgy), or the like. The first chip bumps 280 may include or may be formed of, but is not limited to, metals such as tin (Sn). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first semiconductor chip 200 may be placed on the upper surface of the first package substrate 100. The first semiconductor chip 200 may be electrically connected to the first package substrate 100. For example, a plurality of first chip bumps 280 may be interposed between the first package substrate 100 and the first semiconductor chip 200. The first semiconductor chip 200 may be mounted on the upper surface of the first package substrate 100 through the first chip bumps 280. The first semiconductor chip 200 may be mounted on the first package substrate 100 by a flip chip bonding method, but is not limited thereto.

In some embodiments, the first semiconductor chip 200 may include a first semiconductor substrate 210, chip wiring layers 220 and 225, and a first through via 240. Although not shown, the first semiconductor chip 200 may include a chip pad that is connected to the first chip bump 280 or a second chip bump 380 to be described below.

The first semiconductor substrate 210 may be, for example, bulk silicon or SOI (silicon-on-insulator). The first semiconductor substrate 210 may be a silicon substrate or may include other substances, for example, silicon germanium, indium antimonide, lead tellurium compounds, indium arsenic, indium phosphide, gallium arsenide or gallium antimonide. In some embodiments, the first semiconductor substrate 210 may have an epitaxial layer formed on a base substrate.

The first semiconductor substrate 210 may include a front side (i.e., a bottom side when the first semiconductor substrate 210 is attached to the first package substrate 100) facing the first package substrate 100, and a back side (i.e., a top side when the first semiconductor substrate 210 is attached to the first package substrate 100) opposite to the front side. The front side of the first semiconductor substrate 210 may be an active surface at which a semiconductor element layer is formed. The semiconductor element layer may include various microelectronic elements, for example, MOSFET (metal-oxide-semiconductor field effect transistor) such as CMOS transistor (complementary metal-insulator-semiconductor transistor), system LSI (large scale integration), flash memory, dynamic random access memory (DRAM), static random access memory (SRAM), electrically erasable programmable read-only memory (EEPROM), phase-change random access memory (PRAM), magnetoresistive random access memory (MRAM), resistive random access memory (RERAM), or an image sensor such as CIS (CMOS imaging sensor), MEMS (micro-electro-mechanical system), an active element, a passive element, and the like.

The chip wiring layers 220 and 225 may be placed on the front side of the first semiconductor substrate 210. For example, the chip wiring layers 220 and 225 may be interposed between the first package substrate 100 and the first semiconductor substrate 210. The chip wiring layers 220 and 225 may electrically connect the first package substrate 100 to the first semiconductor substrate 210. For example, the chip wiring layers 220 and 225 may include an inter-chip wiring insulating film 220 that covers the front side of the first semiconductor substrate 210, and a chip wiring structure 225 in the inter-chip wiring insulating film 220. The chip wiring structure 225 may include chip wiring patterns 225*a* having a multi-layer structure (i.e., a multi-level structure), and chip via plugs 225*b* that interconnect the chip wiring patterns 225*a*. The semiconductor element layer of the first semiconductor substrate 210 may be electrically connected to the first package substrate (100 or the first chip bumps 280) through the chip wiring structure 225. In FIG. 2, the arrangement and number of chip wiring patterns 225*a* and chip via plugs 225*b* are only exemplary, and are not limited thereto.

The chip wiring structure 225 may include, for example, a conductive film, and a barrier film interposed between the conductive film and the inter-chip wiring insulating film 220. The conductive film of the chip wiring structure 225 may include or may be formed of, but is not limited to, at least one of, for example, tungsten (W), aluminum (Al), and copper (Cu). The barrier film of the chip wiring structure 225 may include or may be formed of, but is not limited to, for example, at least one of titanium (Ti), titanium nitride (TiN), tantalum (Ta), and tantalum nitride (TaN).

The first through via 240 may be placed inside the first semiconductor substrate 210. The first through via 240 extends in a vertical direction (e.g., a Z direction) intersecting the upper surface of the first package substrate 100, and may penetrate the first semiconductor substrate 210. Further, the first through via 240 may be connected to the chip wiring layers 220 and 225. Therefore, the first through via 240 may electrically connect the chip wiring layers 220 and 225 to second semiconductor chips 300 to be described below.

The first through via 240 may include, for example, a columnar conductive film extending in the vertical direction (e.g., the Z direction), and a barrier film interposed between the conductive film and the first semiconductor substrate 210. The conductive film of the first through via 240 may include or may be formed of, but is not limited to, for example, at least one of Cu alloys such as Cu, CuSn, CuMg, CuNi, CuZn, CuPd, CuAu, CuRe, and CuW, W alloys, Ni, Ru, and Co. The barrier film of the first through via 240 may include or may be formed of, but is not limited to, for example, at least one of titanium (Ti), titanium nitride (TiN), tantalum (Ta), or tantalum nitride (TaN), rubidium (Ru), cobalt (Co), manganese (Mn), tungsten nitride (WN), nickel (Ni), and nickel boride (NiB).

The first through via 240 may further include an insulating film interposed between the barrier film and the first semiconductor substrate 210. The insulating film of the first through via 240 may include or may be formed of, but is not limited to, for example, at least one of an oxide film, a nitride film, a carbide film, a polymer, or a combination thereof.

In some embodiments, a first underfill 290 may be formed between the first package substrate 100 and the first semiconductor chip 200. The first underfill 290 may fill a region between the first package substrate 100 and the first semiconductor chip 200. The first underfill 290 may fix the first semiconductor chip 200 onto the first package substrate 100 to prevent breakage or the like of the first semiconductor chip 200. Further, the first underfill 290 may cover the side surfaces of each of the first chip bumps 280. In some embodiments, the first underfill 290 may fill spaces between two adjacent first chip bumps 280. The first underfill 290 may include or may be formed of, but is not limited to, an insulating polymeric material such as EMC (epoxy molding compound).

In some embodiments, the first semiconductor chip 200 may be a logic semiconductor chip. For example, the first semiconductor chip 200 may be, but it is not limited to, a CPU (Central Processing Unit), a GPU (Graphic Processing Unit), a FPGA (Field-Programmable Gate Array), a digital signal processor, an encryption processor, a micro processor, a micro controller, and an application processor (AP) such as an ASIC (Application-Specific IC).

Figure 11:
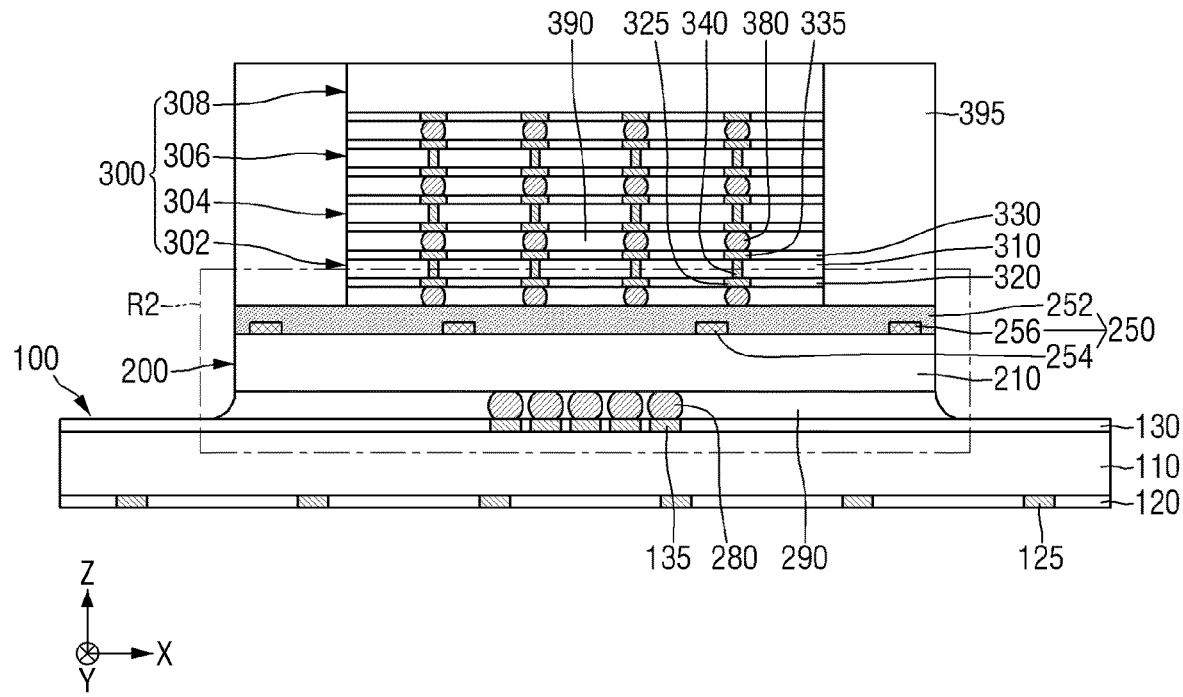
FIG. 11 is a cross-sectional view for explaining a semiconductor package according to some embodiments.

The thermoelectric cooling layer 250 may be placed on a surface of the first semiconductor chip 200 (for example, the lower surface 200L of the first semiconductor chip 200). In some embodiments, the thermoelectric cooling layer 250 may be placed on the upper surface 200U of the first semiconductor chip 200, as shown in FIG. 11. The thermoelectric cooling layer 250 may generate a heat flux by utilizing a Peltier effect. In some embodiments, the thermoelectric cooling layer 250 may include a cooling material layer 252, a first electrode pattern 254, and a second electrode pattern 256.

The cooling material layer 252 may be attached onto the surface of the first semiconductor chip 200 (for example, the lower surface 200L of the first semiconductor chip 200 or the upper surface 200U of the first semiconductor chip 200). In some embodiments, the cooling material layer 252 may include a semiconductor film (e.g., a silicon film). For example, the cooling material layer 252 may be formed from a silicon wafer. The cooling material layer 252 including the semiconductor material may be attached to the surface of the first semiconductor chip 200 by, for example, a D2 W (die to wafer) bonding method.

In some embodiments, the cooling material layer 252 may include a silicon film formed in a two-dimensional structure. For example, the cooling material layer 252 may include a holey silicon film. The holey silicon film may include a plurality of holes extending in the vertical direction (e.g., the Z direction). When the cooling material layer 252 includes a silicon film formed in a two-dimensional structure, the thermal conductivity may be sharply reduced to have excellent thermoelectric properties (e.g., may have a ZT value of a level similar to $Bi_2Te_3$). In some embodiments, the silicon film of the cooling material layer 252 may be a holey silicon film.

In some embodiments, the cooling material layer 252 may include a semiconductor film containing impurities (e.g., a silicon film). As an example, the cooling material layer 252 may include a p-type semiconductor material containing p-type impurities (e.g., boron (B), aluminum (Al), etc.). In some embodiments, the cooling material layer 252 may include an n-type semiconductor material containing n-type impurities (e.g., phosphorus (P), arsenic (As), etc.). In some embodiments, the semiconductor film of the cooling material layer 252 may be a p-type semiconductor material doped with p-type impurities or an n-type semiconductor material doped with n-type impurities.

A thickness TH1 of the cooling material layer 252 may be, for example, about 1 µm to about 100 µm. In some embodiments, the thickness TH1 of the cooling material layer 252 may be about 1 µm to about 50 µm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first electrode pattern 254 is placed in the cooling material layer 252 and may be joined to the cooling material layer 252. For example, the first electrode pattern 254 may contact the cooling material layer 252. The first electrode pattern 254 may be formed to surround the plurality of first chip bumps 280 from a planar viewpoint (i.e., when viewed in a plan view). For example, as shown in FIG. 3, the first electrode pattern 254 may be in the form of a closed loop that surrounds a plurality of first chip bumps 280. In some embodiments, the first chip bumps 280 may be disposed only within the closed loop of the first electrode pattern 254 from a planar viewpoint.

The second electrode pattern 256 is placed in the cooling material layer 252 and may be joined to the cooling material layer 252. For example, the second electrode pattern 256 may contact the cooling material layer 252. The second electrode pattern 256 may be separated from the plurality of first chip bumps 280 farther than the first electrode pattern 254. For example, as shown in FIG. 3, the second electrode pattern 256 may have a closed loop shape that surrounds the first electrode pattern 254. In some embodiments, the second electrode pattern 256 may extend along the edge of the cooling material layer 252. In some embodiments, the first chip bumps 280 may be disposed only within the closed loop of the first electrode pattern 254 from a planar viewpoint, and no chip bumps for connection between the thermoelectric cooling layer 250 and the first package substrate 100 may be disposed in a region between the closed loop of the second electrode pattern 256 and the closed loop of the first electrode pattern 254 from the planar viewpoint.

The first electrode pattern 254 and the second electrode pattern 256 may be placed apart from each other in the horizontal direction (e.g., an X-Y plane) parallel to the upper surface of the first package substrate 100. At least a part of the cooling material layer 252 may be interposed between the first electrode pattern 254 and the second electrode pattern 256.

The first electrode pattern 254 may be formed with predetermined sizes S11 and S12 to surround the plurality of first chip bumps 280. For example, a size S11 of the first electrode pattern 254 in the first direction X may be about 1 mm to about 5 mm, and a size S12 of the first electrode pattern 254 in the second direction Y may be about 5 mm to about 15 mm. In some embodiments, the size S11 of the first electrode pattern 254 in the first direction X may be about 3 mm to about 5 mm, and the size S12 of the first electrode pattern 254 in the second direction Y may be about 9 mm to about 12 mm.

The second electrode pattern 256 may be formed with predetermined sizes S21 and S22 to surround the first electrode pattern 254. For example, the sizes S21 and S22 of the second electrode pattern 256 in the first direction X and the second direction Y may be about 10 mm to about 50 mm, respectively. In some embodiments, the sizes S21 and S22 of the second electrode pattern 256 in the first direction X and the second direction Y may be about 10 mm to about 15 mm, respectively.

As shown in FIG. 2, each of a thickness TH21 of the first electrode pattern 254 and a thickness TH22 of the second electrode pattern 256 may be smaller than a thickness TH1 of the cooling material layer 252. Each of the thickness TH21 of the first electrode pattern 254 and the thickness TH22 of the second electrode pattern 256 may be, for example, about 0.1 µm to about 10 µm, respectively. In some embodiments, each of the thickness TH21 of the first electrode pattern 254 and the thickness TH22 of the second electrode pattern 256 may be about 1 µm to about 2 µm. In some embodiments, the thickness TH21 of the first electrode pattern 254 and the thickness TH22 of the second electrode pattern 256 may be the same as each other.

Although the thickness TH21 of the first electrode pattern 254 and the thickness TH22 of the second electrode pattern 256 are only shown as being the same as each other, this is only exemplary, and the thicknesses may, of course, be different from each other. A width W1 of the first electrode pattern 254 and a width W2 of the second electrode pattern 256 may be the same as each other. This is only exemplary, and in some embodiments, the widths W1 and W2 may be different from each other.

Each of the first electrode pattern 254 and the second electrode pattern 256 may include or may be formed of a metal film. In some embodiments, each of the first electrode pattern 254 and the second electrode pattern 256 may include or may be formed of at least one of copper (Cu) and aluminum (Al).

In some embodiments, at least one of the first electrode pattern 254 and the second electrode pattern 256 may be exposed from the cooling material layer 252. As an example, as shown in FIG. 2, the first electrode pattern 254 and the second electrode pattern 256 may be exposed from the lower surface 250L of the cooling material layer 252.

Different voltages may be applied to the first electrode pattern 254 and the second electrode pattern 256. For example, the first electrode pattern 254 and the second electrode pattern 256 may have different potentials from each other. Accordingly, the thermoelectric cooling layer 250 may generate a heat flux in a direction from the first electrode pattern 254 to the second electrode pattern 256 by utilizing the Peltier effect.

In some embodiments, due to the potential difference between the first electrode pattern 254 and the second electrode pattern 256, a heat transfer medium of the cooling material layer 252 may move from the first electrode pattern 254 toward the second electrode pattern 256. According to the flow of the heat transfer medium, heat may move from the first electrode pattern 254 to the second electrode pattern 256. An endothermic phenomenon may occur in the first electrode pattern 254, and an exothermic phenomenon may occur in the second electrode pattern 256. Since the first electrode pattern 254 and the second electrode pattern 256 may be spaced apart from each other in the horizontal direction (e.g., the X-Y plane), the thermoelectric cooling layer 250 may generate a heat flux in the horizontal direction (e.g., the X-Y plane).

As an example, the cooling material layer 252 may include a semiconductor film (e.g., a silicon film), and the potential of the first electrode pattern 254 may be lower than the potential of the second electrode pattern 256. Accordingly, the heat transfer medium (e.g., free electrons) of the cooling material layer 252 may move from the first electrode pattern 254 toward the second electrode pattern 256, and the endothermic phenomenon of the first electrode pattern 254 and the exothermic phenomenon of the second electrode pattern 256 may be induced. In some embodiments, a negative (−) voltage may be applied to the first electrode pattern 254, and a ground voltage may be applied to the second electrode pattern 256.

In some embodiments, the cooling material layer 252 may include an n-type semiconductor material including n-type impurities (e.g., phosphorus (P), arsenic (As), etc.). In such a case, the potential of the first electrode pattern 254 may be lower than the potential of the second electrode pattern 256. As an example, a negative (−) voltage may be applied to the first electrode pattern 254, and a ground voltage (or a positive (+) voltage) may be applied to the second electrode pattern 256. Accordingly, the electrons of the cooling material layer 252 may move from the first electrode pattern 254 toward the second electrode pattern 256, and the endothermic phenomenon of the first electrode pattern 254 and the exothermic phenomenon of the second electrode pattern 256 may be induced.

In some embodiments, the cooling material layer 252 may include a p-type semiconductor material including p-type impurities (e.g., boron (B), aluminum (Al), etc.). In such a case, the potential of the first electrode pattern 254 may be higher than the potential of the second electrode pattern 256. As an example, the positive (+) voltage may be applied to the first electrode pattern 254, and the ground voltage (or negative (−) voltage) may be applied to the second electrode pattern 256. Accordingly, holes of the cooling material layer 252 may move from the first electrode pattern 254 toward the second electrode pattern 256, and the endothermic phenomenon of the first electrode pattern 254, and the exothermic phenomenon of the second electrode pattern 256 may be induced.

In some embodiments, the thermoelectric cooling layer 250 may be interposed between the first package substrate 100 and the first semiconductor chip 200. For example, the upper surface 250U of the thermoelectric cooling layer 250 may face the lower surface 200L of the first semiconductor chip 200. In some embodiments, the upper surface 250U of the thermoelectric cooling layer 250 may contact the lower surface 200L of the first semiconductor chip 200. As an example, the cooling material layer 252 may cover the lower surface 200L of the chip wiring layers 220 and 225 facing the first package substrate 100. In some embodiments, the cooling material layer 252 may contact the lower surface 200L of the chip wiring layers 220 and 225 and may be adjacent to the first package substrate 100. An upper surface of the cooling material layer 252 may correspond to the upper surface 250U of the thermoelectric cooling layer 250.

In some embodiments, the thermoelectric cooling layer 250 may further include a cooling layer wiring structure 258. The cooling layer wiring structure 258 may electrically connect the first package substrate 100 to the first semiconductor chip 200. For example, the cooling layer wiring structure 258 may include cooling layer wiring patterns 258a and 258c having a multi-layer structure, and a cooling layer via plug 258b that interconnects the cooling layer wiring patterns 258a and 258c with each other. The chip wiring structure 225 of the first semiconductor chip 200 may be electrically connected to the first package substrate (100 or the first chip bumps 280) through the cooling layer wiring structure 258. In FIG. 2, the arrangement and number of the cooling layer wiring patterns 258a and 258c and the cooling layer via plug 258b are only exemplary, and are not limited thereto.

In some embodiments, some of the first chip bumps 280 may apply voltage to at least one of the first electrode pattern 254 and the second electrode pattern 256.

As an example, the cooling layer wiring patterns 258a and 258c may include first level wiring patterns connected to some of the first chip bumps 280. The first level wiring patterns may include a first connector pattern 258a extend along the lower surface 250L of the thermoelectric cooling layer 250, and may connect some of the first chip bumps 280 to the first electrode pattern 254. In some embodiments, the first connector pattern 258a may extend along the lower surface 250L of the thermoelectric cooling layer 250 to contact the first electrode pattern 254 side by side, and the first electrode pattern 254 may be electrically connected to a chip bump of the first chip bumps 280 via the first connector pattern 258a. In some embodiments, the first electrode pattern 254 may be electrically connected to two or more chip bumps of the first chip bumps 280 via the first connector pattern 258a. Accordingly, a voltage may be applied to the first electrode pattern 254. For example, a voltage may be applied to a first chip bump which is electrically connected to a first connector pattern 258a among the first level wiring patterns. The first connector pattern 258a may contact the first electrode pattern 254, which receives the voltage applied to the first chip bump. The first electrode pattern 254 and the first connector pattern 258a may contact each other side by side.

As an example, the cooling layer wiring patterns 258a and 258c may include second level wiring patterns including a second connector pattern 258c separated from the lower surface 250L of the thermoelectric cooling layer 250 farther than the first level wiring patterns including the first connector pattern 258a. The second connector pattern 258c may be connected to a wiring pattern 258d of the first level wiring patterns through the cooling layer via plug 258b. The second electrode pattern 256 may be connected to some others of the first chip bumps 280 through the wiring pattern 258d, the cooling layer via plug 258b and the second connector pattern 258c of the second level wiring patterns. In some embodiments, one end of the second connector pattern 258c may be electrically connected to the second electrode pattern 256 via the cooling layer via plug 258b, and the other end of the second connector pattern 258c may be electrically connected to a chip bump of the first chip bumps 280 via the cooling layer via plug 258b and the wiring pattern 258d. The wiring pattern 258d may not be electrically connected to the first electrode pattern 254. In some embodiments, two or more chip bumps of the first chip bumps 280 may be electrically connected to the second electrode pattern 256 via the second connector pattern 258c. Accordingly, a voltage different from that of the first electrode pattern 254 may be applied to the second electrode pattern 256.

The plurality of second semiconductor chips 300 may be stacked on the upper surface 200U of the first semiconductor chip 200. The second semiconductor chips 300 may be electrically connected to the first semiconductor chip 200. For example, a plurality of second chip bumps 380 may be interposed between the first semiconductor chip 200 and the second semiconductor chips 300. The second semiconductor chips 300 may be mounted on the upper surface 200U of the first semiconductor chip 200 through the second chip bumps 380. The second semiconductor chips 300 may be mounted on the first semiconductor chip 200 by a flip chip bonding method, but is not limited thereto.

In some embodiments, each second semiconductor chip 300 may include a second semiconductor substrate 310, a first chip pad 325, a second chip pad 335, and a second through via 340. Although not shown, each second semiconductor chip 300 may include the semiconductor element layer, the chip wiring layer and the like explained above using the first semiconductor chip 200.

The second semiconductor substrate 310 may be, for example, bulk silicon or SOI (silicon-on-insulator). The second semiconductor substrate 310 may be a silicon substrate. In some embodiments, the second semiconductor substrate 310 may be a silicon substrate including other substances, for example, silicon germanium, indium antimonide, lead tellurium compounds, indium arsenic, indium phosphide, gallium arsenide or gallium antimonide. In some embodiments, the second semiconductor substrate 310 may have an epitaxial layer formed on the base substrate.

The first chip pad 325 may be exposed from the lower surface of the second semiconductor chip 300. For example, a first chip protective layer 320 that covers the lower surface of the second semiconductor substrate 310 may be formed. The first chip pad 325 may be exposed from the first chip protective layer 320.

The second chip pad 335 may be exposed from the upper surfaces of the second semiconductor chips 300. For example, a second chip protective layer 330 that covers the upper surface of the second semiconductor substrate 310 may be formed. The second chip pad 335 may be exposed from the second chip protective layer 330.

The first chip protective layer 320 and the second chip protective layer 330 may protect the semiconductor element layer or the wiring structure formed inside the second semiconductor chip 300 from external impact or moisture. Each of the first chip protective layer 320 and the second chip protective layer 330 may include or may be formed of, but are not limited to, for example, at least one of silicon nitride, silicon oxide, and silicon oxynitride.

Each of the first chip pad 325 and the second chip pad 335 may include or may be formed of, but are not limited to, at least one of copper (Cu), beryllium copper, nickel (Ni), and stainless steel.

The second chip bumps 380 may electrically connect the stacked second semiconductor chips 300 with each other. For example, the second chip bumps 380 may be in contact with a second chip pad 335 of the second semiconductor chip (e.g., 302) placed at the lower part and a first chip pad 325 of the second semiconductor chip (e.g., 304) placed at the upper part. The second chip bumps 380 may be, but are not limited to, for example, a micro bump, a UBM (under bump metallurgy), and the like.

The second through via 340 extends in the vertical direction (e.g., the Z direction) and may penetrate the second semiconductor substrate 310. Further, the second through via 340 may electrically connect the first chip pad 325 to the second chip pad 335 of the second semiconductor chips 300. Therefore, the second chip bumps 380 and the second through via 340 may electrically connect the stacked second semiconductor chips 300 with each other.

In some embodiments, a second underfill 390 may be formed between the first semiconductor chip 200 and the second semiconductor chips 300, and between the stacked second semiconductor chips 300. The second underfill 390 fills the region between the first semiconductor chip 200 and the second semiconductor chips 300, and the region between the stacked second semiconductor chips 300. The second underfill 390 may cover the side surfaces of each second chip bump 380. The second underfill 390 may include or may be formed of, but is not limited to, insulating polymeric materials such as EMC.

In some embodiments, each of the second semiconductor chips 300 may be a memory semiconductor chip. For example, the second semiconductor chips 300 may include memory semiconductor chips 302, 304, 306 and 308 sequentially stacked on the first semiconductor chip 200. The number of stacked memory semiconductor chips 302, 304, 306 and 308 is only exemplary and is not limited thereto. Each of the memory semiconductor chips 302, 304, 306 and 308 may be a volatile memory such as DRAM (dynamic random access memory) or SRAM (static random access memory), or a non-volatile memory such as a flash memory, PRAM (Phase-change Random Access Memory), MRAM (Magnetoresistive Random Access Memory), FeRAM (Ferroelectric Random Access Memory) or RRAM (Resistive Random Access Memory). In some embodiments, the second semiconductor chips 300 may form a high bandwidth memory (HBM) stacked on the first semiconductor chip 200.

The first molding member 395 may be formed on the upper surface of the first package substrate 100. The first molding member 395 may cover the first semiconductor chip 200 and at least some of the second semiconductor chips 300. As an example, the first molding member 395 may cover the upper surface of the first semiconductor chip 200 and the side surfaces of the second semiconductor chip 300. In some embodiments, the first molding member 395 may have a side surface vertically aligned with a side surface of the first semiconductor chip 200, without covering the side surface of the first semiconductor chip 200.

The first molding member 395 may include or may be formed of, but is not limited to, an insulating polymeric material such as EMC. In some embodiments, the first underfill 290 and/or the second underfill 390 may include a substance different from the first molding member 395. For example, each of the first underfill 290 and the second underfill 390 may include or may be formed of an insulating substance having fluidity superior to the first molding member 395 to efficiently fill the narrow space.

In order to achieve a high capacity of the semiconductor package, it is desirable to stack more semiconductor chips than before. However, in such a case, the heat radiation characteristic of the semiconductor chip is deteriorated, and there arises a problem that the performance is restricted by the temperature. As an example, a hotspot region HS in which heat is concentrated on the chip bumps (e.g., the first chip bumps 280) on which the semiconductor chip is mounted may be formed. Such a hotspot region HS may be more severe, especially around the semiconductor chip (e.g., the first semiconductor chip 200) placed at the lowermost part among the stacked semiconductor chips.

The semiconductor package according to some embodiments may improve the heat radiation characteristic in the hot spot region HS by including the thermoelectric cooling layer 250. In some embodiments, as described above, the thermoelectric cooling layer 250 may generate a heat flux in the direction from the first electrode pattern 254 toward the second electrode pattern 256, using the Peltier effect. Accordingly, it is possible to provide a semiconductor package capable of selectively improving the heat radiation characteristics of a specific region (for example, the hot spot region HS).

Further, as described above, the thermoelectric cooling layer 250 may generate a heat flux in the horizontal direction (for example, the X-Y plane). Accordingly, the thermoelectric cooling layer 250 may improve the heat radiation characteristics of a specific region (e.g., the hotspot region HS) regardless of the number of semiconductor chips (e.g., the second semiconductor chips 300) stacked in the vertical direction (e.g., the Z direction). Accordingly, it is possible to provide a semiconductor package having improved product reliability and performance.

FIGS. 4 to 8 are various partially enlarged views for explaining a semiconductor package according to some embodiments. For convenience of explanation, repeated parts of contents explained above using FIGS. 1 to 3 will be briefly explained or omitted.

Figure 4:
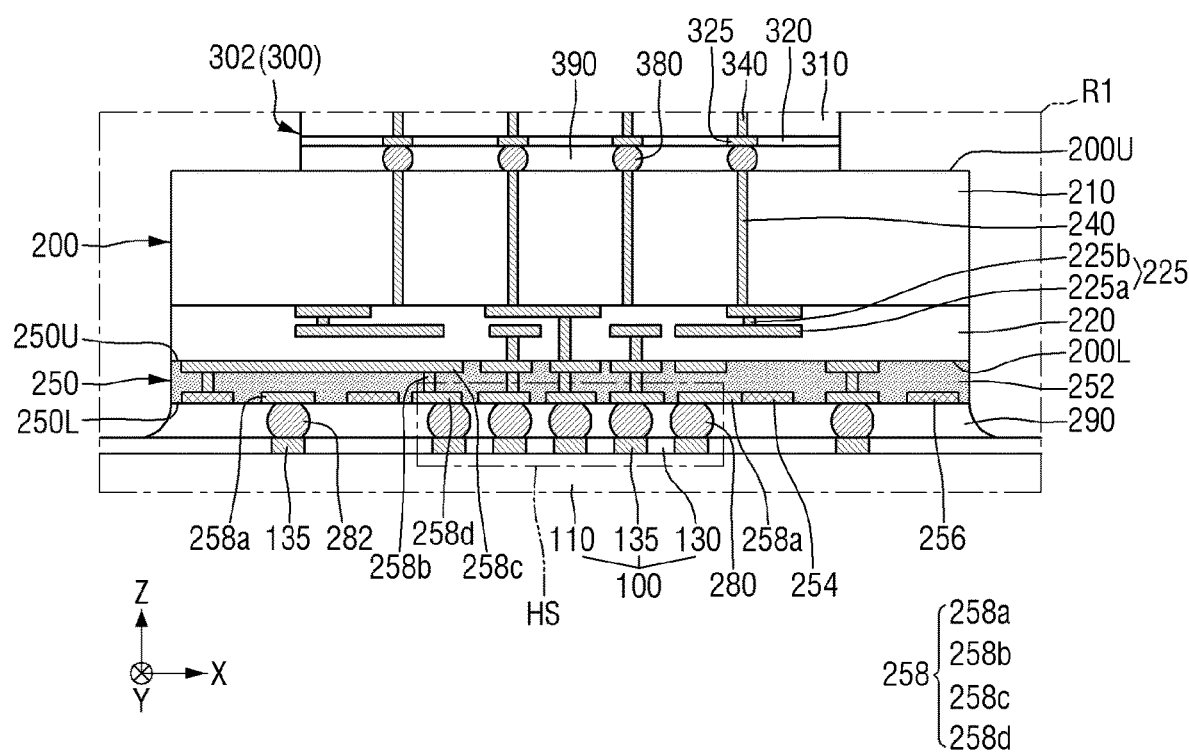
FIGS. 4 to 8 are various partially enlarged views for explaining a semiconductor package according to some embodiments.

Referring to FIG. 4, the semiconductor package according to some embodiments further includes a third chip bump 282.

The third chip bump 282 may be interposed between the first package substrate 100 and the first semiconductor chip 200. The third chip bump 282 may electrically connect the first package substrate 100 to the first semiconductor chip 200. In some embodiments, the third chip bump 282 may connect the second substrate pad 135 to the cooling layer wiring structure 258. In some embodiments, the third chip bump 282 may be formed at the same level as the first chip bump 280. As used herein, the term "same level" means formation by the same manufacturing process.

The third chip bump 282 may be interposed between the first electrode pattern 254 and the second electrode pattern 256 from a planar viewpoint. For example, the third chip bump 282 may be placed in a region other than the hotspot region HS formed by the plurality of first chip bumps 280. Since the thermoelectric cooling layer 250 may generate a heat flux in the direction from the first electrode pattern 254 toward the second electrode pattern 256, heat generated from the third chip bump 282 interposed between the first electrode pattern 254 and the second electrode pattern 256 may also be efficiently radiated. In some embodiments, the third chip bump 282 may be electrically connected to the first electrode pattern 254 via the first connector pattern 258*a* of first level wiring patterns. In some embodiments, unlike the shown example, the third chip bump 282 may not be in contact with the first connector pattern 258*a* of first level wiring patterns and not be electrically connected to the first electrode pattern 254.

Figure 5:
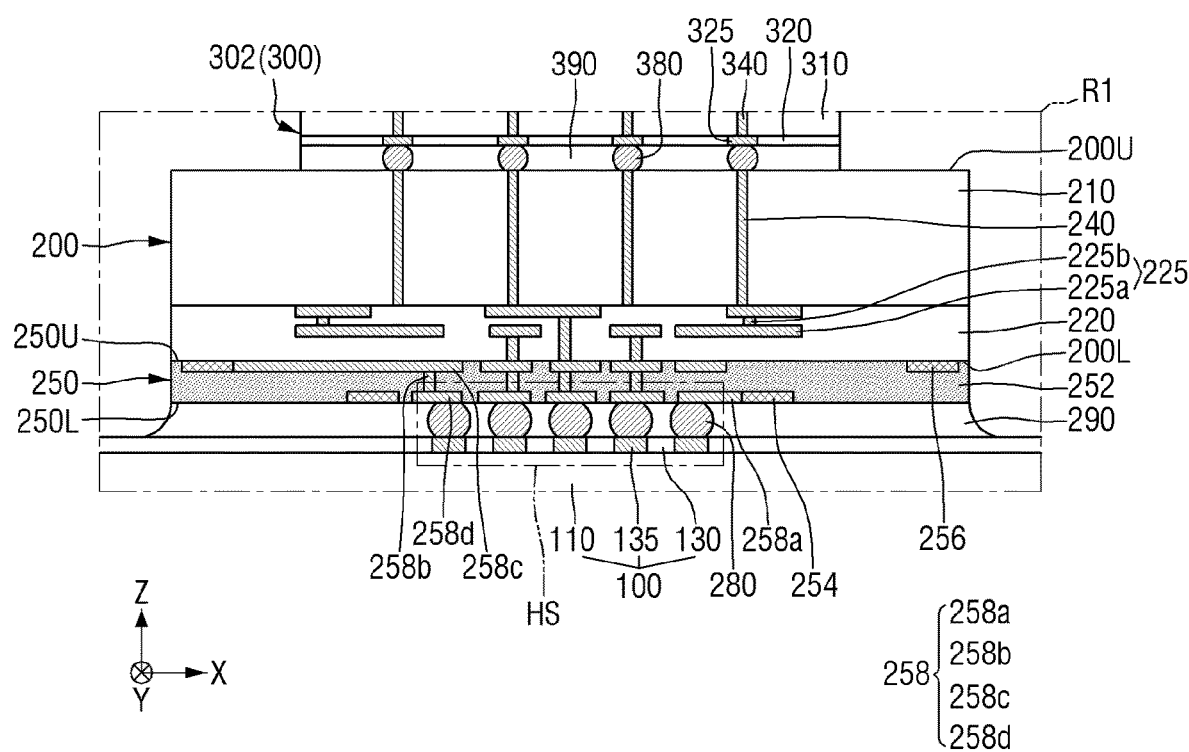

Referring to FIG. 5, in the semiconductor package according to some embodiments, the first electrode pattern 254 is closer to the lower surface 250L of the thermoelectric cooling layer 250 than the second electrode pattern 256.

For example, the first electrode pattern 254 may be exposed from the lower surface 250L of the thermoelectric cooling layer 250, and the second electrode pattern 256 may be exposed from the upper surface 250U of the thermoelectric cooling layer 250.

In some embodiments, the first level wiring patterns may include a first connector pattern 258*a* extending along the lower surface 250L of the thermoelectric cooling layer 250. The first connector pattern 258*a* may connect some of the first chip bumps 280 to the first electrode pattern 254. For example, the first connector pattern 258*a* may electrically connect the first electrode pattern 254 to a chip bump of the first chip bumps 280. In some embodiments, the first connector pattern 258*a* and the first electrode pattern 254 may contact each other side by side. In some embodiments, two or more chip bumps of the first chip bumps 280 may be electrically connected to the first electrode pattern 254 via the first connector pattern 258*a*. In some embodiments, the second electrode pattern 256 may be connected to some others of the first chip bumps 280 through a wiring pattern 258*d* of the first level wiring patterns, the cooling layer via plug 258*b* and a second connector pattern 258*c* of the second level wiring patterns. In some embodiments, one end of the second connector pattern 258*c* may be connected to the second electrode pattern 256, and the other end of the second connector pattern 258*c* may be electrically connected to a chip bump of the first chip bumps 280 via the cooling layer via plug 258*b* and the wiring pattern 258*d*. In some embodiments, the one end of the second connector pattern 258*c* and the second electrode pattern 256 may contact each other side by side.

Figure 6:
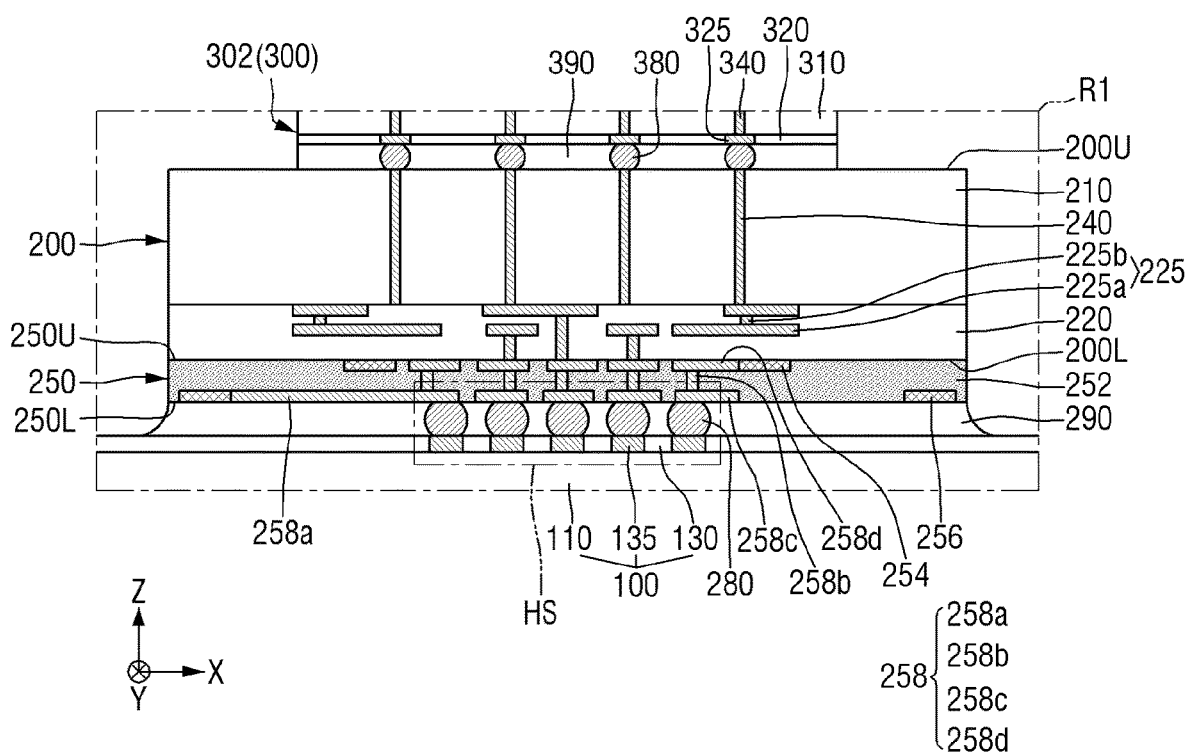

Referring to FIG. 6, in the semiconductor package according to some embodiments, the first electrode pattern 254 is spaced apart from the lower surface 250L of the thermoelectric cooling layer 250 farther than the second electrode pattern 256.

For example, the first electrode pattern 254 may be exposed from the upper surface 250U of the thermoelectric cooling layer 250, and the second electrode pattern 256 may be exposed from the lower surface 250L of the thermoelectric cooling layer 250.

In some embodiments, the first level wiring patterns may include a first connector pattern 258*a* which extends along the lower surface 250L of the thermoelectric cooling layer 250. The first connector pattern 258*a* may connect some of the first chip bumps 280 to the second electrode pattern 256. In some embodiments, one end of the first connector pattern 258*a* may be connected to the second electrode pattern 256, and the other end of the first connector pattern 258*a* may be connected to a chip bump of the first chip bumps 280. In some embodiments, the one end of the first connector pattern 258*a* and the second electrode pattern 256 may contact each other side by side. In some embodiments, the first electrode pattern 254 may be connected to some others of the first chip bumps 280 through a wiring pattern 258*d*, the cooling layer via plug 258*b* and a second connector pattern 258*c* of the second level wiring patterns. In some embodiments, the second connector pattern 258*c* may contact the first electrode pattern 254 side by side, and may be connected to a chip bump among the first chip bumps 280 via the cooling layer via plug 258*b* and the wiring pattern 258*d*. Accordingly, different voltages may be applied to the first electrode pattern 254 and the second electrode pattern 256.

Figure 7:
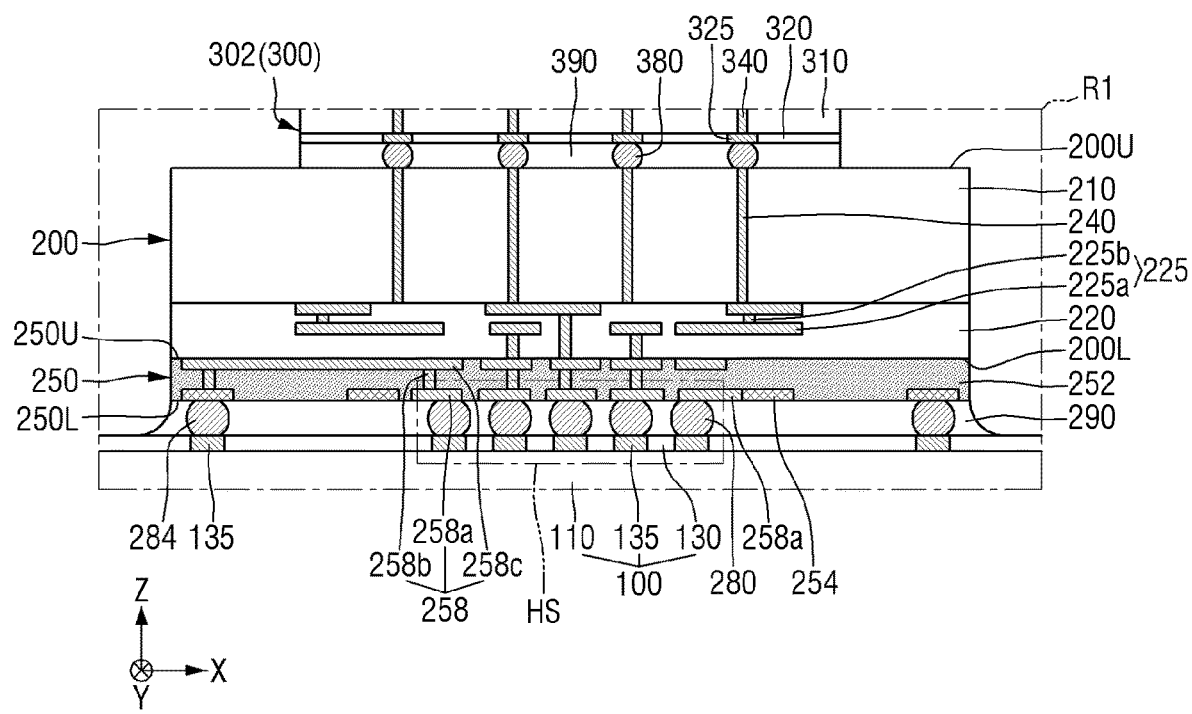

Referring to FIG. 7, the semiconductor package according to some embodiments further includes a fourth chip bump 284.

The fourth chip bump 284 may be interposed between the first package substrate 100 and the first semiconductor chip 200. The fourth chip bump 284 may electrically connect the first package substrate 100 to the first semiconductor chip 200. In some embodiments, the fourth chip bump 284 may be formed at the same level as the first chip bumps 280.

The fourth chip bump 284 may be connected to the second electrode pattern 256. For example, the fourth chip bump 284 may connect the second substrate pad 135 and the second electrode pattern 256. The fourth chip bump 284 connected to the second electrode pattern 256 may provide an additional heat transfer path to the second electrode pattern 256 in which the exothermic phenomenon occurs. For example, the fourth chip bump 284 may provide an additional heat transfer path in a direction (e.g., a —Z direction) from the second electrode pattern 256 toward the first package substrate 100. Accordingly, a semiconductor package having further improved heat radiation characteristics may be provided.

Figure 8:
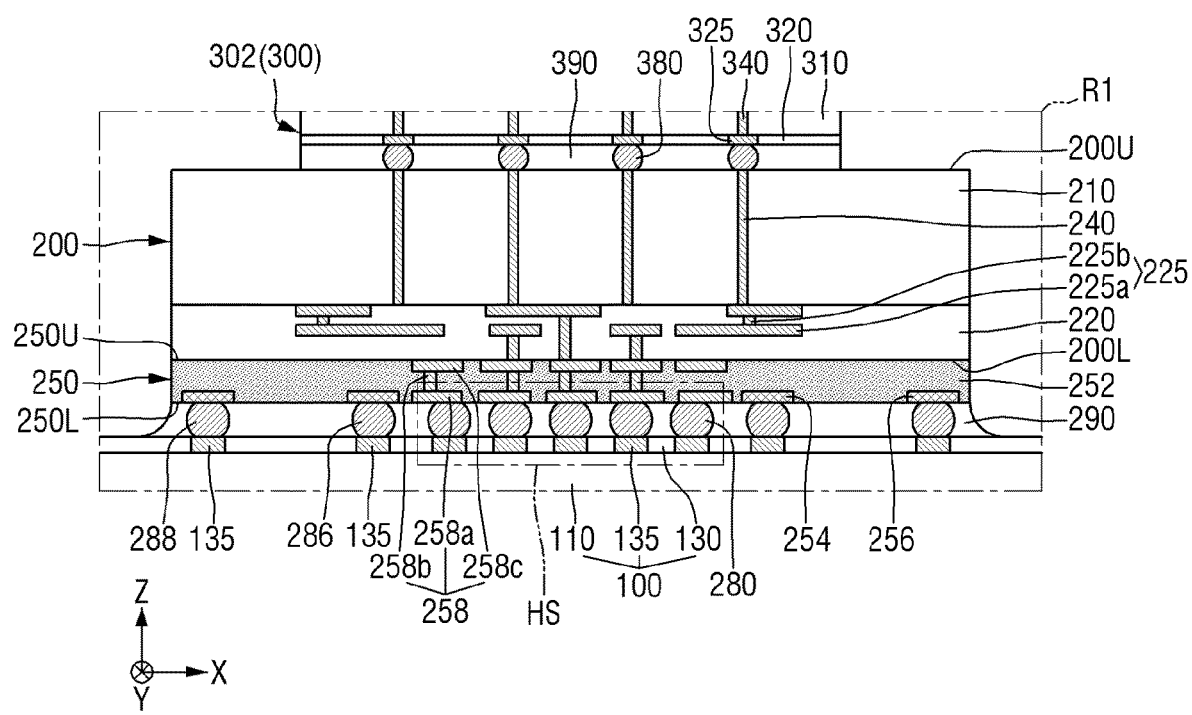

Referring to FIG. 8, the semiconductor package according to some embodiments further includes a fifth chip bump 286 and/or a sixth chip bump 288.

The fifth chip bump 286 may be interposed between the first package substrate 100 and the first semiconductor chip 200. The fifth chip bump 286 may electrically connect the first package substrate 100 to the first semiconductor chip 200. In some embodiments, the fifth chip bump 286 may be formed at the same level as the first chip bump 280.

The fifth chip bump 286 may be connected to the first electrode pattern 254. For example, the fifth chip bump 286 may connect the second substrate pad 135 to the first electrode pattern 254. The fifth chip bump 286 connected to the first electrode pattern 254 may apply a voltage to the first electrode pattern 254. For example, the fifth chip bump 286 may directly apply a voltage to the first electrode pattern 254 without going through the cooling layer wiring structure 258.

The sixth chip bump 288 may be interposed between the first package substrate 100 and the first semiconductor chip 200. The sixth chip bump 288 may electrically connect the first package substrate 100 to the first semiconductor chip 200. In some embodiments, the sixth chip bump 288 may be formed at the same level as the first chip bump 280.

The sixth chip bump 288 may be connected to the second electrode pattern 256. For example, the sixth chip bump 288 may connect the second substrate pad 135 and the second electrode pattern 256. The sixth chip bump 288 connected to the second electrode pattern 256 may apply a voltage to the second electrode pattern 256. For example, the sixth chip bump 288 may directly apply a voltage to the second electrode pattern 256 without going through the cooling layer wiring structure 258. Accordingly, different voltages may be applied to the first electrode pattern 254 and the second electrode pattern 256.

Although not shown, a voltage may be applied to one of the first electrode pattern 254 and the second electrode pattern 256 by some of the first chip bumps 280.

Figure 9:
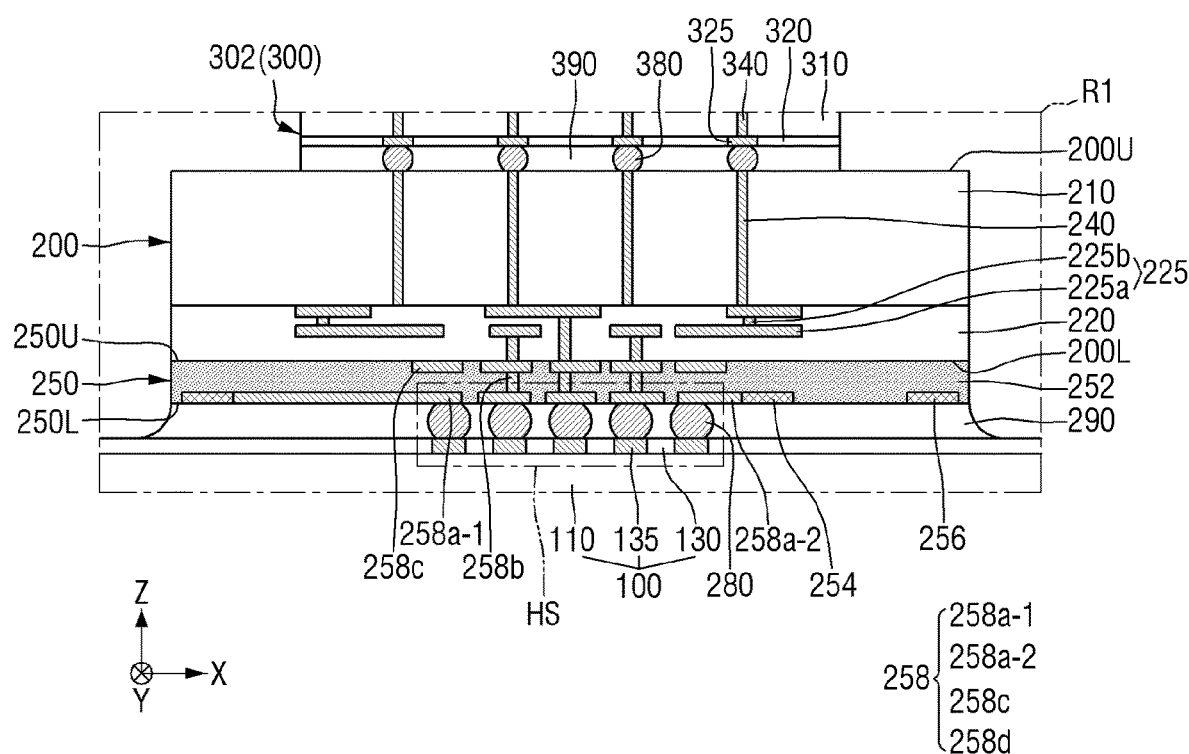
FIG. 9 is a partially enlarged view for explaining a semiconductor package according to some embodiments.
Figure 10:
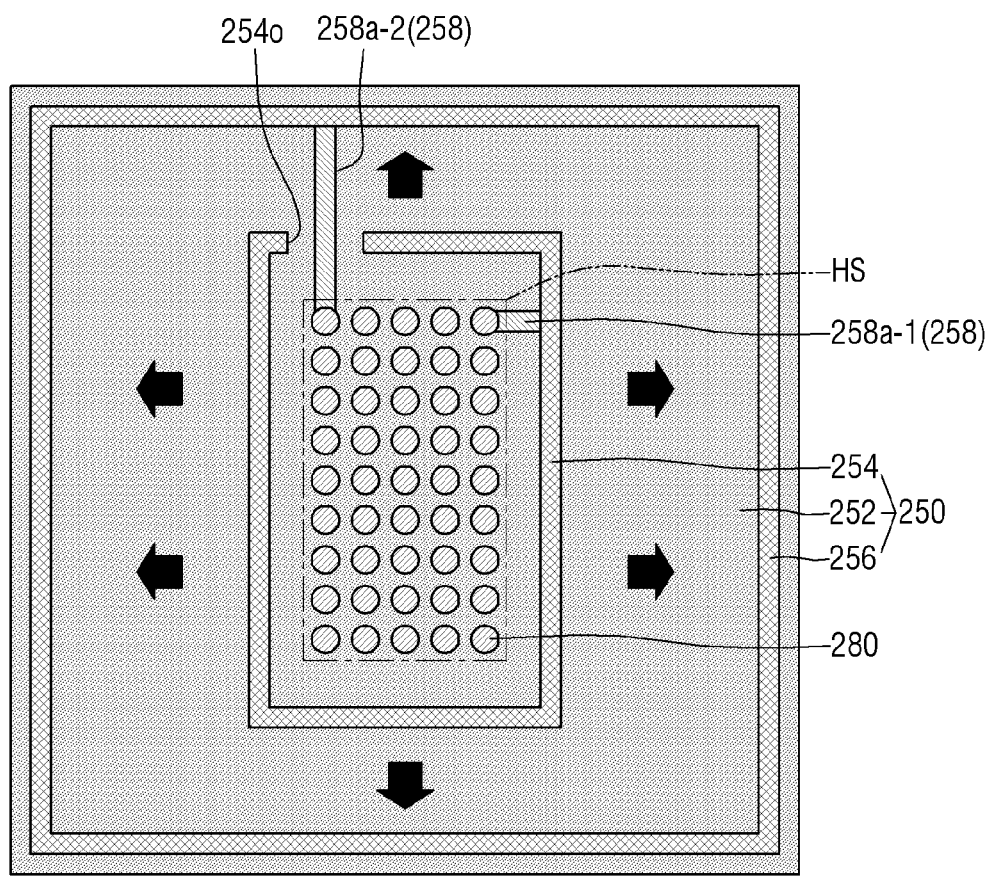
FIG. 10 is a plan view for explaining the thermoelectric cooling layer of FIG. 9.

FIG. 9 is a partially enlarged view for explaining a semiconductor package according to some embodiments. FIG. 10 is a plan view for explaining the thermoelectric cooling layer of FIG. 9. For convenience of explanation, repeated parts of contents explained above using FIGS. 1 to 8 will be briefly explained or omitted.

Referring to FIGS. 9 and 10, in the semiconductor package according to some embodiments, the first electrode pattern 254 includes a spacing 254o.

Because the first electrode pattern 254 includes the spacing 254o, the first electrode pattern 254 may not form a closed loop from a planar viewpoint. That is, the first electrode pattern 254 may not completely surround the plurality of first chip bumps 280 from the planar viewpoint.

In some embodiments, the first level wiring patterns may include a first connector pattern 258a-1 extending along the lower surface 250L of the thermoelectric cooling layer 250. The first connector pattern 258a-1 may connect some of the first chip bumps 280 to the first electrode pattern 254. The first level wiring patterns may further include a second connector pattern 258a-2 extending along the lower surface 250L of the thermoelectric cooling layer 250. The second connector pattern 258a-2 may connect some others of the first chip bumps 280 to the second electrode pattern 256. The second connector pattern 258a-2 connected to the second electrode pattern 256 may be placed to penetrate the spacing 254o of the first electrode pattern 254. In some embodiments, the second connector pattern 258a-2 may extend through the spacing of the first electrode pattern 254, without contacting the first electrode pattern 254, to be connected to the second electrode pattern 256. Accordingly, different voltages may be applied to the first electrode pattern 254 and the second electrode pattern 256.

Figure 12:
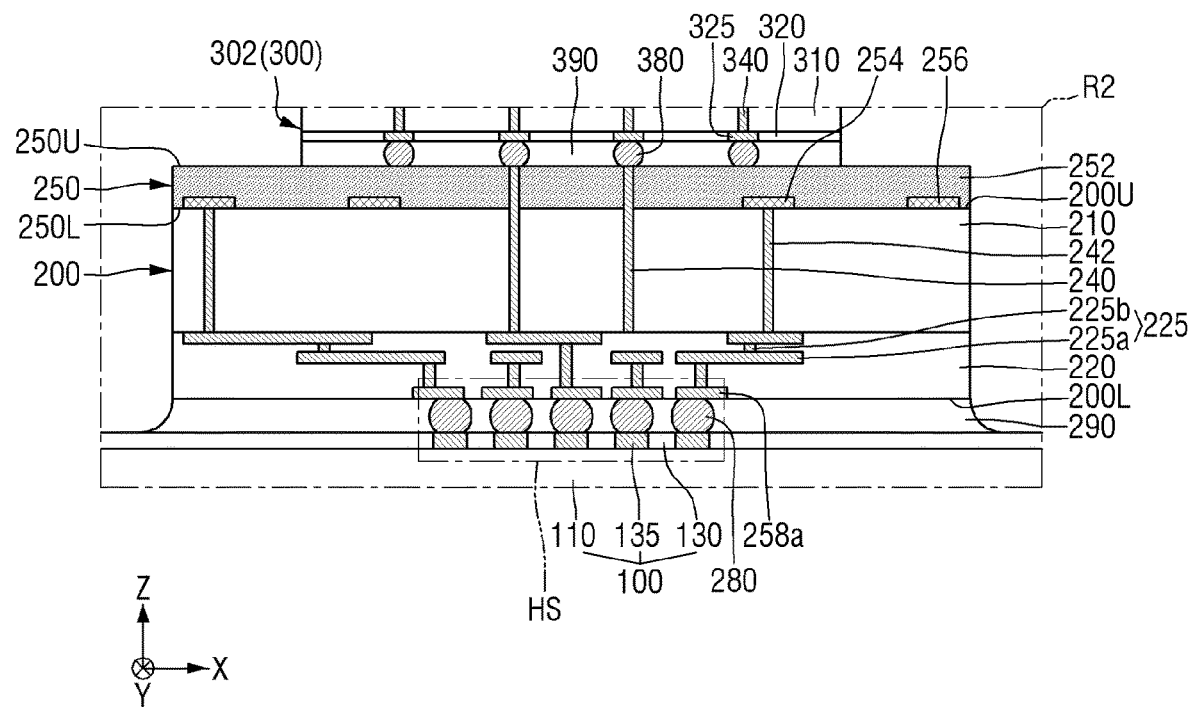
FIG. 12 is a partially enlarged view for explaining a region R2 of FIG. 11.

FIG. 11 is a cross-sectional view for explaining a semiconductor package according to some embodiments. FIG. 12 is a partially enlarged view for explaining a region R2 of FIG. 11. For convenience of explanation, repeated parts of contents explained above using FIGS. 1 to 10 will be briefly described or omitted.

Referring to FIGS. 11 and 12, in the semiconductor package according to some embodiments, the thermoelectric cooling layer 250 is interposed between the first semiconductor chip 200 and the second semiconductor chips 300.

For example, the lower surface 250L of the thermoelectric cooling layer 250 may face the upper surface 200U of the first semiconductor chip 200. As an example, the cooling material layer 252 may cover the upper surface 200U of the first semiconductor substrate 210 facing the second semiconductor chips 300.

In some embodiments, the first semiconductor chip 200 may further include third through vias 242. The third through vias 242 may be placed inside the first semiconductor substrate 210. Each of the third through vias 242 extends in the vertical direction (e.g., the Z direction), and may penetrate the first semiconductor substrate 210.

Some of the third through vias 242 may electrically connect the chip wiring structure 225 to the first electrode pattern 254, and some others of the third through vias 242 may electrically connect the chip wiring structure 225 to the second electrode pattern 256. Accordingly, different voltages may be applied to the first electrode pattern 254 and the second electrode pattern 256.

In some embodiments, the first through via 240 penetrates the first semiconductor substrate 210 and the thermoelectric cooling layer 250, and may electrically connect the chip wiring structure 225 to the second chip bump 380.

Figure 13:
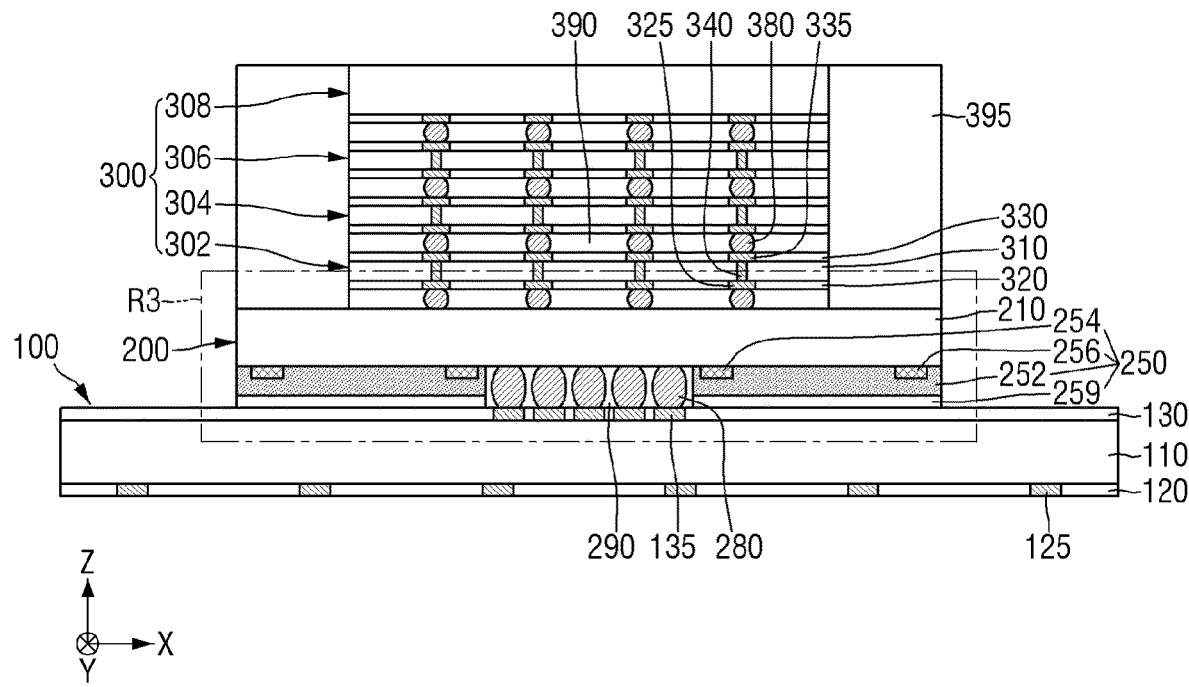
FIG. 13 is a cross-sectional view for explaining a semiconductor package according to some embodiments.
Figure 14:
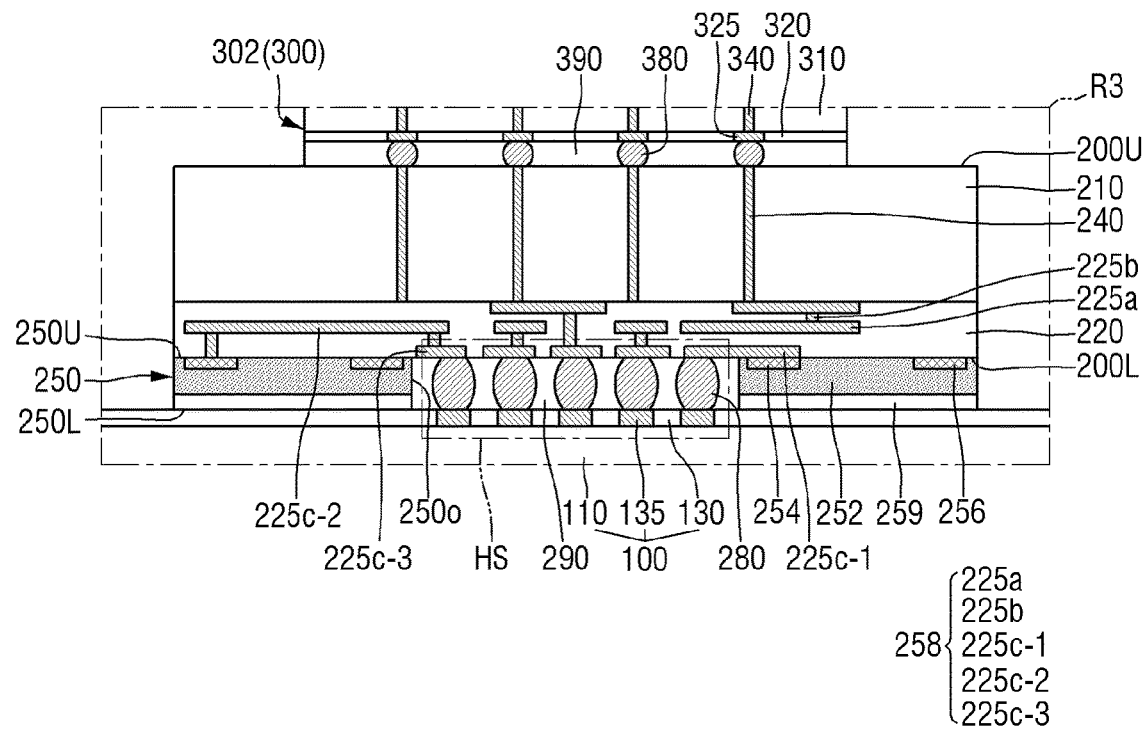
FIG. 14 is a partially enlarged view for explaining a region R3 of FIG. 13.
Figure 15:
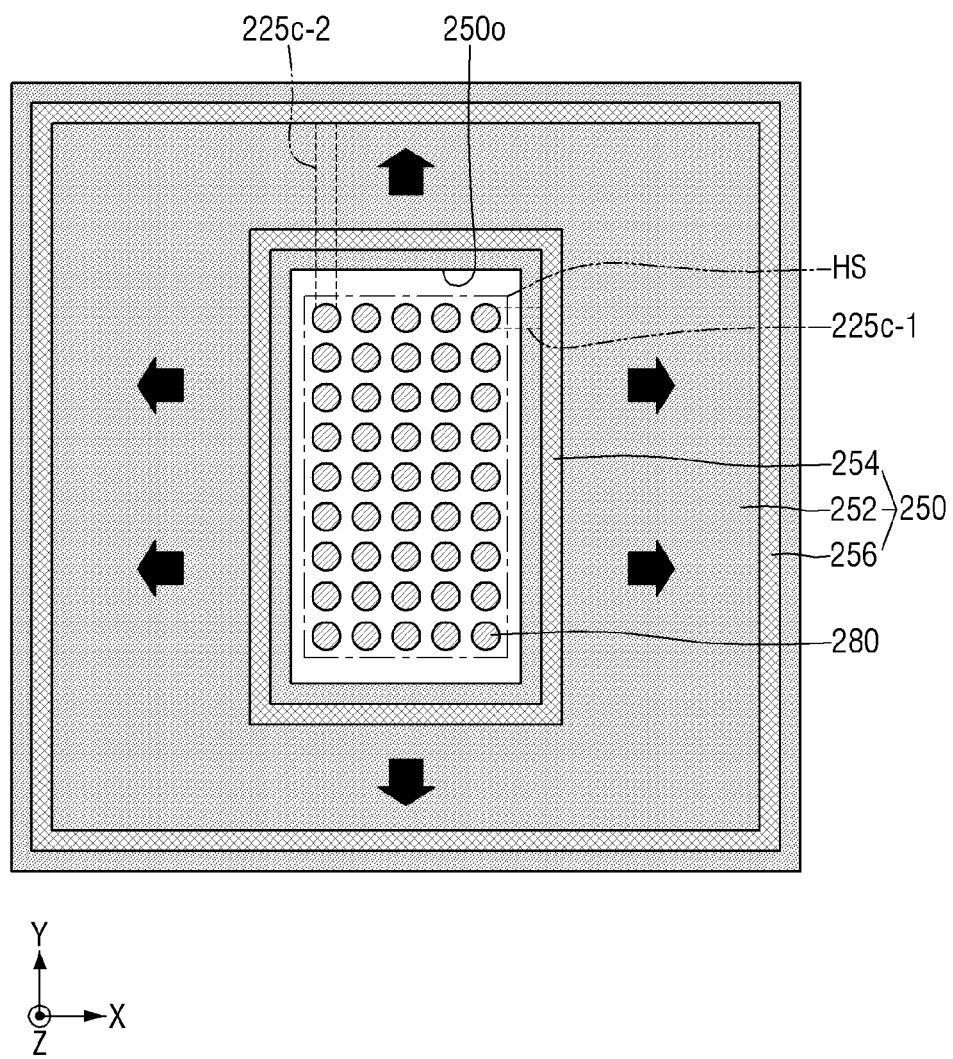
FIG. 15 is a plan view for explaining the thermoelectric cooling layer of FIG. 14.

FIG. 13 is a cross-sectional view for explaining a semiconductor package according to some embodiments. FIG. 14 is a partially enlarged view for explaining a region R3 of FIG. 13. FIG. 15 is a plan view for explaining the thermoelectric cooling layer of FIG. 14. For convenience of explanation, repeated parts of contents explained above using FIGS. 1 to 10 will be briefly described or omitted.

Referring to FIGS. 13 to 15, in the semiconductor package according to some embodiments, the thermoelectric cooling layer 250 includes an opening 250o extending in the vertical direction (e.g., the Z direction).

The opening 250o may be placed inside the first electrode pattern 254 from a planar viewpoint. The plurality of first chip bumps 280 may be placed inside the opening 250o of the thermoelectric cooling layer 250. That is, the thermoelectric cooling layer 250 may have a closed loop shape that generally surrounds the side surfaces of the plurality of first chip bumps 280.

As the plurality of first chip bumps 280 are placed in the opening 250o of the thermoelectric cooling layer 250, the thermoelectric cooling layer 250 may not be interposed between the first chip bumps 280 and the first semiconductor chip 200. For example, the plurality of first chip bumps 280 may be electrically connected to the chip wiring structure 225 without going through the thermoelectric cooling layer 250.

In some embodiments, the first electrode pattern 254 and the second electrode pattern 256 may be exposed from the upper surface 250U of the cooling material layer 252. In some embodiments, a first connector pattern 225c-1, which is included in the chip wiring structure 225, extends along the upper surface 250U of the first underfill 290 and the upper surface 250U of the thermoelectric cooling layer 250, and may connect some of the first chip bumps 280 to the first electrode pattern 254. In some embodiments, the second electrode pattern 256 may be connected to some others of the first chip bumps 280 through the chip via plugs 225b, a wiring pattern 225c-3, and a second connector pattern 225c-2. The wiring pattern 225c-3 and the second connector pattern 225c-2 are included in the chip wiring structure 225. Accordingly, different voltages may be applied to the first electrode pattern 254 and the second electrode pattern 256.

In some embodiments, the thermoelectric cooling layer 250 may further include an adhesive layer 259. The adhesive layer 259 may be interposed between the first package substrate and the cooling material layer 252. The cooling material layer 252 may be attached onto the first package substrate through the adhesive layer 259. The adhesive layer 259 may include or may be formed of, but is not limited to, a TIM (thermal interface material) substance. The TIM substance may include a resin of monomer or polymer having thermally conductive particles. For example, the adhesive layer 259 may include or may be formed of, but is not limited to, at least one of aluminum oxide (AlO), zinc oxide (ZnO), thermosetting resins, and/or combinations thereof.

Figure 16:
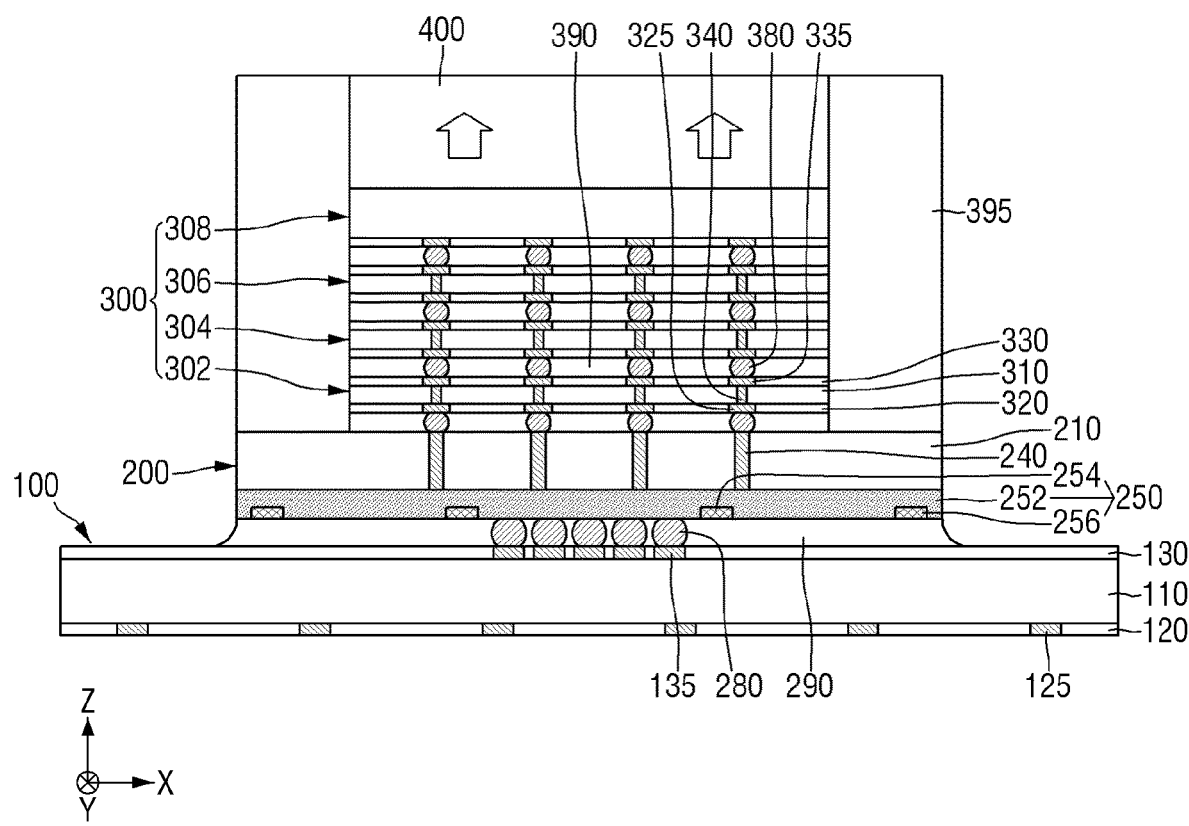
FIG. 16 is a cross-sectional view for explaining a semiconductor package according to some embodiments.

FIG. 16 is a cross-sectional view for explaining a semiconductor package according to some embodiments. For convenience of explanation, repeated parts of contents explained above using FIGS. 1 to 15 will be briefly explained or omitted.

Referring to FIG. 16, the semiconductor package according to some embodiments further includes a cooling element 400.

The cooling element 400 may be placed on the second semiconductor chips 300. The cooling element 400 may generate a heat flux in a direction away from the second semiconductor chip 300 (e.g., the Z direction). Accordingly, a semiconductor package in which an additional heat transfer path is secured, and the heat radiation characteristics are further improved in the vertical direction (e.g., the Z direction) may be provided.

The cooling element 400 may include or may be, but is not limited to, at least one of a Peltier cooler, a heat spreader (or a heat slug), and a heat sink.

Figure 17:
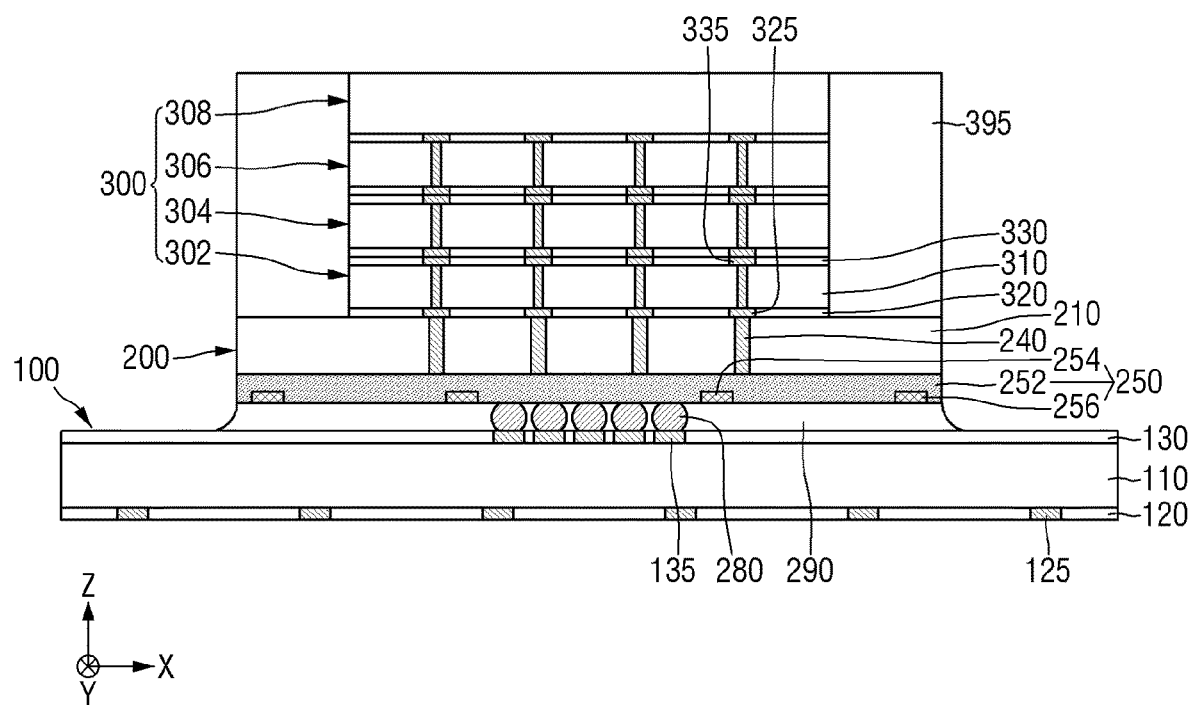
FIG. 17 is a cross-sectional view for explaining a semiconductor package according to some embodiments.

FIG. 17 is a cross-sectional view for explaining a semiconductor package according to some embodiments. For convenience of explanation, repeated parts of contents explained above using FIGS. 1 to 16 will be briefly described or omitted.

Referring to FIG. 17, in the semiconductor package according to some embodiments, the plurality of second semiconductor chips 300 are directly bonded to each other.

For example, unlike the semiconductor package of FIG. 1 in which the second semiconductor chips 300 are interconnected by the second chip bump 380, the second semiconductor chips 300 according to the present embodiment may be directly interconnected by a direct bonding method. In such a case, the second semiconductor chips 300 may not be spaced apart from each other. The direct bonding method may include a C2C (chip to chip; or D2D (die to die)) method or a W2W (wafer to wafer) method. The C2C method may refer to a method of stacking in chip units, and the W2W method may refer to a method of manufacturing a chip through a dicing process after stacking in wafer units.

As an example, the direct bonding method described above may mean a method of electrically connecting a bonding metal (e.g., the second chip pad 335 of 302) formed at the uppermost part of a lower chip (e.g., 302) and a bonding metal (e.g., the first chip pad 325 of 304) formed at the lowermost part of the upper chip. For example, when the bonding metal is formed of copper (Cu), the bonding method may be a Cu—Cu bonding method, and the bonding metal may also be formed of aluminum or tungsten.

As another example, the direct bonding method may mean a method of attaching an insulating film (e.g., the second chip protective layer 330 of 302) formed at the uppermost part of the lower chip and an insulating film (e.g., the first chip protective layer 320 of 304) formed at the lowermost part of the upper chip. For example, when the insulating film is formed of an oxide film, the direct bonding method may be an oxide film bonding method.

Figure 18:
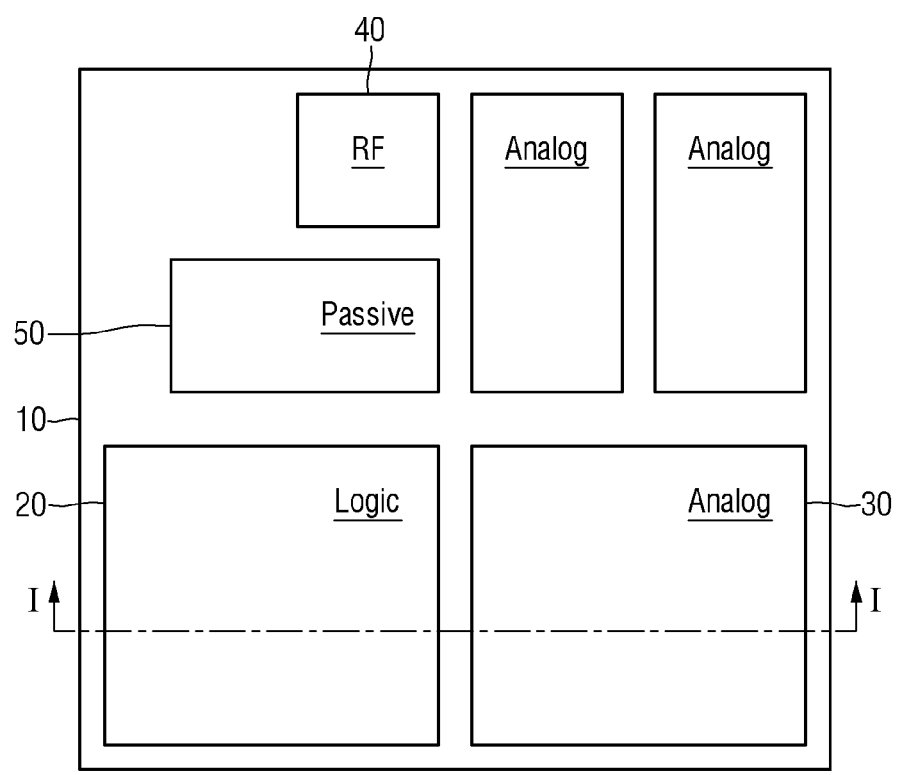
FIG. 18 is a plan view for explaining a semiconductor package according to some embodiments.
Figure 19:
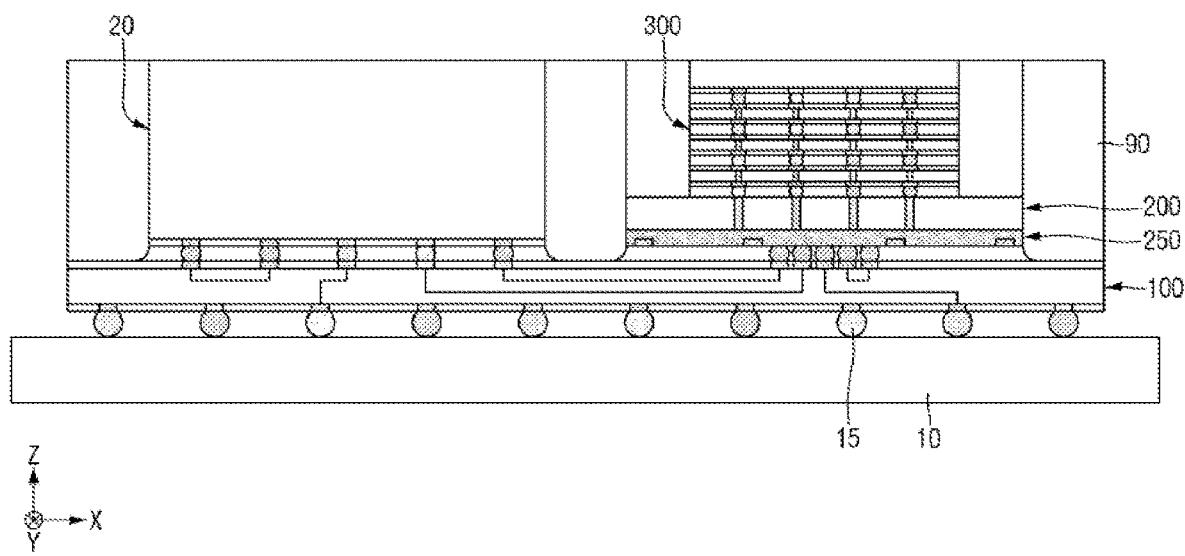
FIG. 19 is a cross-sectional view taken along I-I of FIG. 18.

FIG. 18 is a plan view for explaining a semiconductor package according to some embodiments. FIG. 19 is a cross-sectional view taken along I-I of FIG. 18. For convenience of explanation, repeated parts of contents explained above using FIGS. 1 to 17 will be briefly described or omitted.

Referring to FIGS. 18 and 19, the semiconductor package according to some embodiments includes a second package substrate 10, a logic element 20, analog elements 30, an RF element 40, a passive element 50, and a second molding member 90.

The analog elements 30 may correspond to the semiconductor packages explained above referring to FIGS. 1 to 17, respectively. For example, the analog elements 30 may include the first package substrate 100, the first semiconductor chip 200, the thermoelectric cooling layer 250, and the second semiconductor chips 300 explained above referring to FIGS. 1 to 17, respectively. In FIG. 18, the arrangement, number, or the like of the analog elements 30 are only exemplary, and are not limited thereto.

The second package substrate 10 may be, for example, a printed circuit board (PCB), a ceramic substrate or an interposer. In some embodiments, the second package substrate 10 may be a substrate for wafer level package (WLP) or a substrate for package level package (PLP). The second package substrate 10 may include a substrate base 110, a first substrate pad 125, and a second substrate pad 135.

When the second package substrate 10 is a printed circuit board, the second package substrate 10 may include a substrate base, and pads formed on each of the upper surface and the lower surface of the substrate base. The pads may be exposed by solder resist layers that cover the upper surface and the lower surface of the substrate base, respectively. The substrate base may also include conductive vias and conductive wirings that are electrically connected to the pads.

The substrate base may be made up of at least one substance selected from phenol resin, epoxy resin, and polyimide. For example, the substrate base may include at least one substance selected from FR4, tetrafunctional polyimide, polyphenylene ether, epoxy/polyphenylene oxide, BT (bismaleimide triazine), thermount, cyanate ester, polyimide, and liquid crystal polymer.

The first package substrate 100 may be placed on the upper surface of the second package substrate 10. The first package substrate 100 may be electrically connected to the second package substrate 10. For example, a plurality of substrate bumps 15 may be interposed between the second package substrate 10 and the first package substrate 100. The first package substrate 100 may be mounted on the upper surface of the second package substrate 10 through the substrate bumps 15.

The logic element 20 may be mounted on the upper surface of the first package substrate 100. The logic element 20 may be a logic semiconductor chip. For example, the logic element 20 may be, but is not limited to, a CPU (Central Processing Unit), a GPU (Graphic Processing Unit), a FPGA (Field-Programmable Gate Array), a digital signal processor, an encryption processor, a micro processor, a micro controller, and an application processor (AP) such as an ASIC (Application-specific IC).

In some embodiments, the logic element 20 may be spaced apart from the analog elements 30 in the horizontal direction (e.g., the X-Y plane).

In some embodiments, at least some of the conductive wirings in the first package substrate 100 may electrically connect the logic element 20 to the analog elements 30. For example, the first package substrate 100 may be an interposer that electrically connects the logic element 20 and the analog elements 30.

The RF element 40 may be an antenna element for transmitting and receiving radio waves of radio frequency, and may include a plurality of filters. The RF element 40 may operate in various wireless communication environments such as a 3G wireless communication environment, a 4G wireless communication environment, and a 5G wireless communication environment.

The passive element 50 may include an impedance element for impedance matching, an MLCC (multi-layer ceramic capacitor) for noise isolation, and the like.

The second molding member 90 may be formed on the upper surface of the first package substrate 100. The second molding member 90 may cover at least some of the logic element 20 and the analog elements 30. As an example, the second molding member 90 may cover the upper surface of the first package substrate 100, the side surfaces of the logic element 20, and the side surfaces of the analog elements 30. The second molding member 90 may include or may be formed of, but is not limited to, an insulating polymeric material such as EMC.

Figure 20:
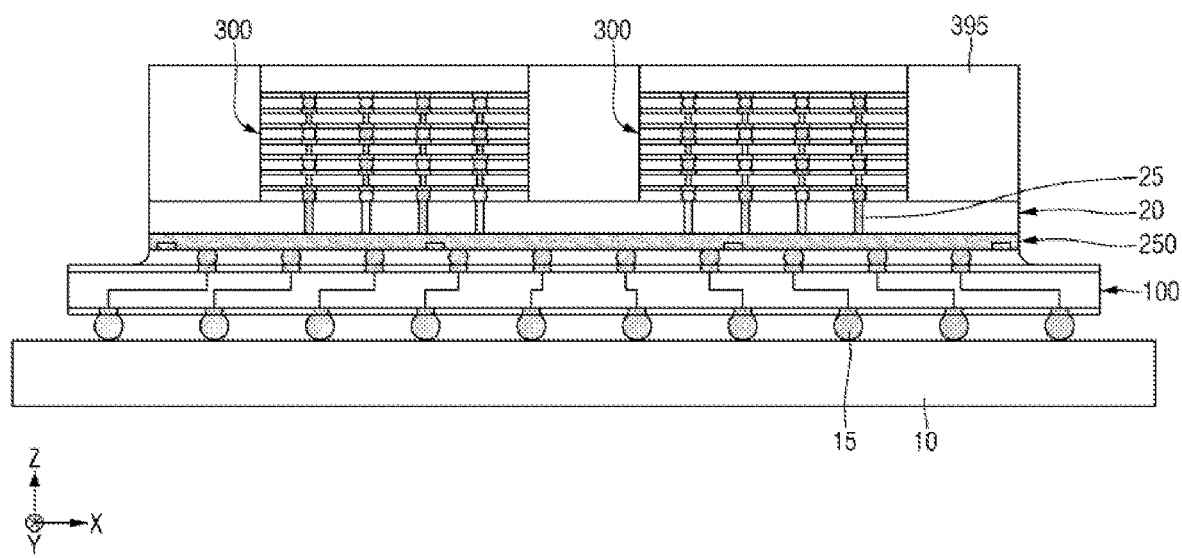
FIG. 20 is a cross-sectional view for explaining a semiconductor package according to some embodiments.

FIG. 20 is a cross-sectional view for explaining a semiconductor package according to some embodiments. For convenience of explanation, repeated parts of contents explained above using FIGS. 1 to 19 will be briefly explained or omitted.

Referring to FIG. 20, the second semiconductor chips 300 are stacked on the upper surface of the logic element 20.

For example, the logic element 20 may include a fourth through via 25. The fourth through via 25 may extend in the vertical direction (e.g., the Z direction) to penetrate the logic element 20. The second semiconductor chips 300 may be electrically connected to the first package substrate 100 through the fourth through via 25.

In some embodiments, the first package substrate 100 may be omitted. In such a case, the second semiconductor chips 300 may be connected to the second package substrate 10 through the fourth through via 25.

In some embodiments, the thermoelectric cooling layer 250 may be placed on the surface of the logic element 20 (e.g., the lower surface of the logic element 20 or the upper surface of the logic element 20). As an example, the thermoelectric cooling layer 250 may be attached onto the lower surface of the logic element 20. The thermoelectric cooling layer 250 placed on the surface of the logic element 20 may generate a heat flux in the horizontal direction (e.g., the X-Y plane), thereby improving the heat radiation characteristics of the hot spot region which may be formed around the logic element 20. Accordingly, a semiconductor package having improved product reliability and performance may be provided.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor package comprising:
   a first package substrate;
   a first semiconductor chip on the first package substrate;
   a plurality of first chip bumps between the first package substrate and the first semiconductor chip;
   a plurality of second semiconductor chips sequentially stacked on the first semiconductor chip;
   a molding member which covers the plurality of second semiconductor chips, on the first semiconductor chip; and
   a thermoelectric cooling layer attached onto a surface of the first semiconductor chip,
   wherein the thermoelectric cooling layer includes:
      a cooling material layer extending along the surface of the first semiconductor chip;
      a first electrode pattern in the cooling material layer and, when the semiconductor package is viewed in a plan view, surrounding a region where the plurality of first chip bumps are disposed; and
      a second electrode pattern in the cooling material layer and, when the semiconductor package is viewed in the plan view, surrounding the first electrode pattern, and
   wherein the first electrode pattern is not overlapped with the region where the plurality of first chip bumps are disposed, in a vertical direction that intersects the surface of the first semiconductor chip.

2. The semiconductor package of claim 1,
   wherein the first electrode pattern and the second electrode pattern have different potentials from each other.

3. The semiconductor package of claim 1,
   wherein the thermoelectric cooling layer further includes a cooling layer wiring structure disposed in the cooling material layer and connected to the plurality of first chip bumps.

4. The semiconductor package of claim 3,
   wherein the cooling layer wiring structure electrically connects the first semiconductor chip to the plurality of first chip bumps.

5. The semiconductor package of claim 3,
   wherein the cooling layer wiring structure is connected to at least one of the first electrode pattern and the second electrode pattern.

6. The semiconductor package of claim 1,
   wherein the first semiconductor chip includes:
      a first semiconductor substrate;
      a chip wiring layer interposed between the first semiconductor substrate and the region where the plurality of first chip bumps are disposed; and a first through via that penetrates the first semiconductor substrate and is connected to the chip wiring layer.

7. The semiconductor package of claim 6,
wherein each of the second semiconductor chips includes:
a second semiconductor substrate;
a second through via penetrating the second semiconductor substrate; and
a second chip bump which connects the first through via to the second through via.

8. The semiconductor package of claim 1,
wherein the first semiconductor chip is a logic semiconductor chip, and
wherein each of the second semiconductor chips is a semiconductor memory chip.

9. The semiconductor package of claim 1, further comprising:
a second package substrate on which the first package substrate is mounted; and
a logic semiconductor chip on the first package substrate,
wherein the first package substrate is an interposer electrically connecting the first semiconductor chip to the logic semiconductor chip.

10. A semiconductor package comprising:
a package substrate;
a plurality of chip bumps on the package substrate;
a semiconductor chip connected to the plurality of chip bumps; and
a thermoelectric cooling layer which includes a cooling material layer extending along a surface of the semiconductor chip, a first electrode pattern being in the cooling material layer and, when the semiconductor package is viewed in a plan view, surrounding a region where the plurality of chip bumps are disposed, and a second electrode pattern in the cooling material layer and spaced apart from the region where the plurality of chip bumps are disposed farther than the first electrode pattern,
wherein the first electrode pattern and the second electrode pattern have different potentials from each other, and
wherein the first electrode pattern is not overlapped with the region where the plurality of chip bumps are disposed, in a vertical direction that intersects the surface of the semiconductor chip.

11. The semiconductor package of claim 10,
wherein a potential of the first electrode pattern is lower than a potential of the second electrode pattern.

12. The semiconductor package of claim 10,
wherein the cooling material layer includes a semiconductor film.

13. The semiconductor package of claim 12,
wherein the semiconductor film of the cooling material layer is a holey silicon (holey Si) film.

14. The semiconductor package of claim 10,
wherein the semiconductor chip includes a semiconductor substrate, a chip wiring layer interposed between the semiconductor substrate and the region where the plurality of chip bumps are disposed, and a first through via which penetrates the semiconductor substrate and is connected to the chip wiring layer.

15. The semiconductor package of claim 14,
wherein the thermoelectric cooling layer is interposed between the chip wiring layer and the region where the plurality of chip bumps are disposed.

16. The semiconductor package of claim 14,
wherein the semiconductor substrate is interposed between the chip wiring layer and the thermoelectric cooling layer.

17. The semiconductor package of claim 16,
wherein the semiconductor chip further includes a second through via that penetrates the semiconductor substrate and connects the chip wiring layer to the thermoelectric cooling layer.

18. The semiconductor package of claim 10,
wherein the thermoelectric cooling layer is interposed between the package substrate and the semiconductor chip,
wherein the thermoelectric cooling layer includes an opening extending in a vertical direction that intersects an upper surface of the package substrate, and
wherein the plurality of chip bumps are placed in the opening.

19. The semiconductor package of claim 18, wherein the thermoelectric cooling layer further includes an adhesive layer interposed between the package substrate and the cooling material layer.

20. A semiconductor package comprising:
a package substrate;
a plurality of chip bumps on the package substrate;
a semiconductor chip which includes a semiconductor substrate, a chip wiring layer that electrically connects the plurality of chip bumps to the semiconductor substrate, and a through via that penetrates the semiconductor substrate and is connected to the chip wiring layer; and
a thermoelectric cooling layer interposed between the chip wiring layer and a region where the plurality of chip bumps are disposed,
wherein the thermoelectric cooling layer includes:
a cooling material layer extending along a lower surface of the chip wiring layer facing the package substrate;
a cooling layer wiring structure disposed in the cooling material layer and electrically connecting at least some of the plurality of chip bumps to the chip wiring layer;
a first electrode pattern in the cooling material layer and, when the semiconductor package is viewed in a plan view, surrounding the region where the plurality of chip bumps are formed; and
a second electrode pattern in the cooling material layer and spaced apart from the region where the plurality of chip bumps are disposed farther than the first electrode pattern, and
wherein the first electrode pattern is not overlapped with the region where the plurality of chip bumps are disposed, in a vertical direction that intersects the lower surface of the chip wiring layer.

* * * * *